(12) United States Patent
Miller et al.

(10) Patent No.: US 8,890,332 B2
(45) Date of Patent: Nov. 18, 2014

(54) SEMICONDUCTOR CHIP LAYOUT WITH STAGGERED TX AND TX DATA LINES

(71) Applicants: Michael J. Miller, Saratoga, CA (US); Mark William Baumann, Campbell, CA (US); Richard S. Roy, Dublin, CA (US)

(72) Inventors: Michael J. Miller, Saratoga, CA (US); Mark William Baumann, Campbell, CA (US); Richard S. Roy, Dublin, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/843,427

(22) Filed: Mar. 15, 2013

(65) Prior Publication Data

US 2013/0313723 A1 Nov. 28, 2013

Related U.S. Application Data

(63) Continuation-in-part of application No. 12/846,763, filed on Jul. 29, 2010.

(51) Int. Cl.
*H01L 29/40* (2006.01)

(52) U.S. Cl.
USPC ........ 257/777; 257/E23.141; 365/51; 365/63; 365/181

(58) Field of Classification Search
CPC .................. H01L 27/10894; H01L 2924/1434
USPC ........ 257/777, E23.141; 365/51, 63, 230, 189
See application file for complete search history.

(56) References Cited

U.S. PATENT DOCUMENTS

2008/0052451 A1* 2/2008 Pua et al. ....................... 711/103
2009/0016714 A1* 1/2009 Soto et al. ........................ 398/20

* cited by examiner

*Primary Examiner* — Elias M Ullah

(57) ABSTRACT

A chip layout for a high speed semiconductor device is disclosed. The chip layout isolates Rx terminals and Rx ports from Tx terminals and Tx ports. A serial interface is centrally located to reduce latency, power and propagation delays. Stacked die that contain one or more devices with the chip layout are characterized by having improved latency, bandwidth, power consumption, and propagation delays.

27 Claims, 19 Drawing Sheets

SEMICONDUCTOR CHIP LAYOUT WITH STAGGERED TX AND TX DATA LINES

CROSS-REFERENCE TO RELATED APPLICATIONS

This application is a continuation-in-part application and claims priority to U.S. utility application Ser. No. 12/846,763, filed Jul. 29, 2010, entitled "Semiconductor Chip Layout," which application is incorporated by reference herein in its entirely.

BACKGROUND

Current memory circuits that use double data rate (DDR) and quadruple data rate (QDR) access schemes have separate address, write data, read data and status pins. These access schemes require high frequency data transmission links that provide low bit error rate (BER), high bandwidth and low on-chip latency. Bandwidth is the amount of information exchanged during read and write operations. Latency is the time lapsed between an event in an input signal and a corresponding event in an output signal that results from the event in the input signal. For example, in a memory circuit latency is the time lapsed between the receipt of a 'Read' command at an input pin of the memory circuit and the transmission of the corresponding read data to the output pins of the memory circuit.

In a device that has a serial transmission link one or more serializer-deserializer (SERDES) circuits convert data packets between serial and parallel formats. It is common practice to place the SERDES circuits and other associated logic components along the periphery of the silicon chip. Such architecture results in a wide spread in latencies in the silicon, depending on the distance between the SERDES and the specific functional block that is the source or the destination of the data. Thus, worst case timing latency is determined by the longest path set by the I/O which is the furthest away from any one device resource. A typical layout of I/O at the periphery would result in the worst case path from one corner of the die to the opposite corner. The resulting distance that an input signal must traverse could be the width plus the height of the die.

Error rates are expected to increase for high speed data links. Many circuits have a cyclic redundancy check (CRC) circuit to perform error checking on data packets. Error checking is performed across the entire data packet, which may be striped across multiple data lines to increase bandwidth and to reduce latency. However, such an approach requires that multiple data lines converge into the CRC circuit to allow error checking, thus adding to the length of the traces that signals must traverse for an operation.

Moreover, heaviest packet traffic in a device typically occurs as communication among functional blocks formed in or on the silicon substrate. Data lines formed in or on the silicon substrate are dimensionally constrained, thus representing significant capacitive and resistive loads to the paths the signals must traverse. In addition, communication lines in or on silicon further need to circumvent the functional blocks that create barriers to signal routing, adding to the lengths of the communication lines. As a result, on die packet traffic routed through communication lines on a silicon substrate with a significant density of functional blocks will experience increased latencies.

In an application using a SERDES circuit, placement of a power pin next to a data pin in a package substrate complicates "signal escape" to an external component. Routing signals in a printed circuit board from a signal pad at the center of the chip through a "picket fence" of power pins exposes the data signal on the signal pad to interference, cross-talk, and distortion. Thus packages where the signal pins are toward the outer edges of the packet reduce the picket fence effect. To overcome the above problem, it is customary to place I/O signals at the edge of the silicon substrate. However such placement can negatively impact the overall latency of the circuit. Package pin-out configuration is a concern in integrated circuit design.

Tx/Rx differential pairs are typically grouped closely together in high speed communication systems. Each Tx transmitter includes a transmit channel that conveys read data and status information out of a package. Each Rx receiver includes a receive channel that receives address, control and write data from outside of the package. In networking devices, the proximity of Tx and Rx channels can result in data crosstalk and an increase in bit flips.

Bandwidth becomes more significant when a SERDES block is combined with a high speed memory block. Due to the proximate locations of Tx to Rx, conventional systems have a significantly limited signal line density, which adversely affects the available bandwidth. In high speed communication systems, it is increasingly critical to have a significant amount of line/signal density for improving the device bandwidth.

U.S. Pat. No. 7,405,946 to Hall et al. ("Hall") separates transmitter contacts from receiver contacts in a high speed interface pattern. However, Tx data channels in Hall's pattern must be positioned parallel to Rx data channels to convey data from the transmitter out to the host. Parallel Tx/Rx channels tend to degrade data signals and increase error rates. In Hall's Tx/Rx pattern, the data line transporting a high speed Tx signal must cross over an Rx data line before exiting the PC board. Such proximity of Rx contacts to Tx contacts contributes to noise coupling between Tx and Rx signals. Thus, Hall does not resolve the problem of Inter Signal Interference (ISI) for high speed data links.

Accordingly, there is a need for an IC device layout that takes into account the routing delay for high speed data signals on a PCB or a SOC. In addition, a need exists for simplified data path routing for high speed networking devices to minimize the routing length through the silicon die. Further, a need exists for reducing the amount of interference between Rx and Tx signals while easing printed circuit board layout.

SUMMARY

The present invention provides a layout for a semiconductor device coupled to a second device. To optimize the high speed transmission rates in the present invention, at least two functional circuit blocks ("IP cores") are symmetrically located with respect to a central axis on a semiconductor die; each core being accessible via a plurality of Tx and Rx data lines. A serial interface is centered on the die between the two IP cores. The serial interface includes multiple ports which serve as nodes coupled to various data lines. In particular, the serial interface includes multiple transmitter ports and multiple receiver ports. The ports are coupled together by Tx data lines and Rx data lines. The die itself has multiple metal layers and is encapsulated in a package having multiple routing layers.

The present invention is also directed to a semiconductor device coupled to a second device, where the semiconductor device contains a die divided into two partitions. An IP core is contained in each partition. Further, multiple receiver terminals are located in the first partition of the die, and multiple transmitter terminals are located in the second partition of the die. A serial interface is further incorporated on the die and is positioned adjacent to one of the IP cores, wherein the serial interface includes transmitter ports and receiver ports. The IC device also includes Tx data lines, originating from respective Tx ports wherein each Tx port serializes and transmits a serial data signal for output on a Tx data line to one of said IP cores; and Rx data lines, originating from respective receiver ports, wherein each receiver port receives and deserializes a serial data signal for output on an Rx data line to one of said IP cores.

Another embodiment of the invention is directed to a stacked die that includes multiple dies attached together. At least one die in the stack assembly has Rx terminals in a first partition of the die and Tx terminals in a second partition of the die. At least one of the dies in the stack has a serial interface in a central region of the chip layout. Thus, it is not necessary for all the dies in the stack assembly to have the same chip layout as the die of the present invention.

The invention is also directed to a stacked die assembly that operates with reduced power, and propagation delay. By centrally locating the SERDES interface on the top surface of the die the driving distance is reduced by approximately one half. The reduced driving distance correlated to the layout of the invention reduces the system latency as well as power.

Other features of the invention will be described in connection with the accompanying drawings.

DETAILED DESCRIPTION

Figure 1:
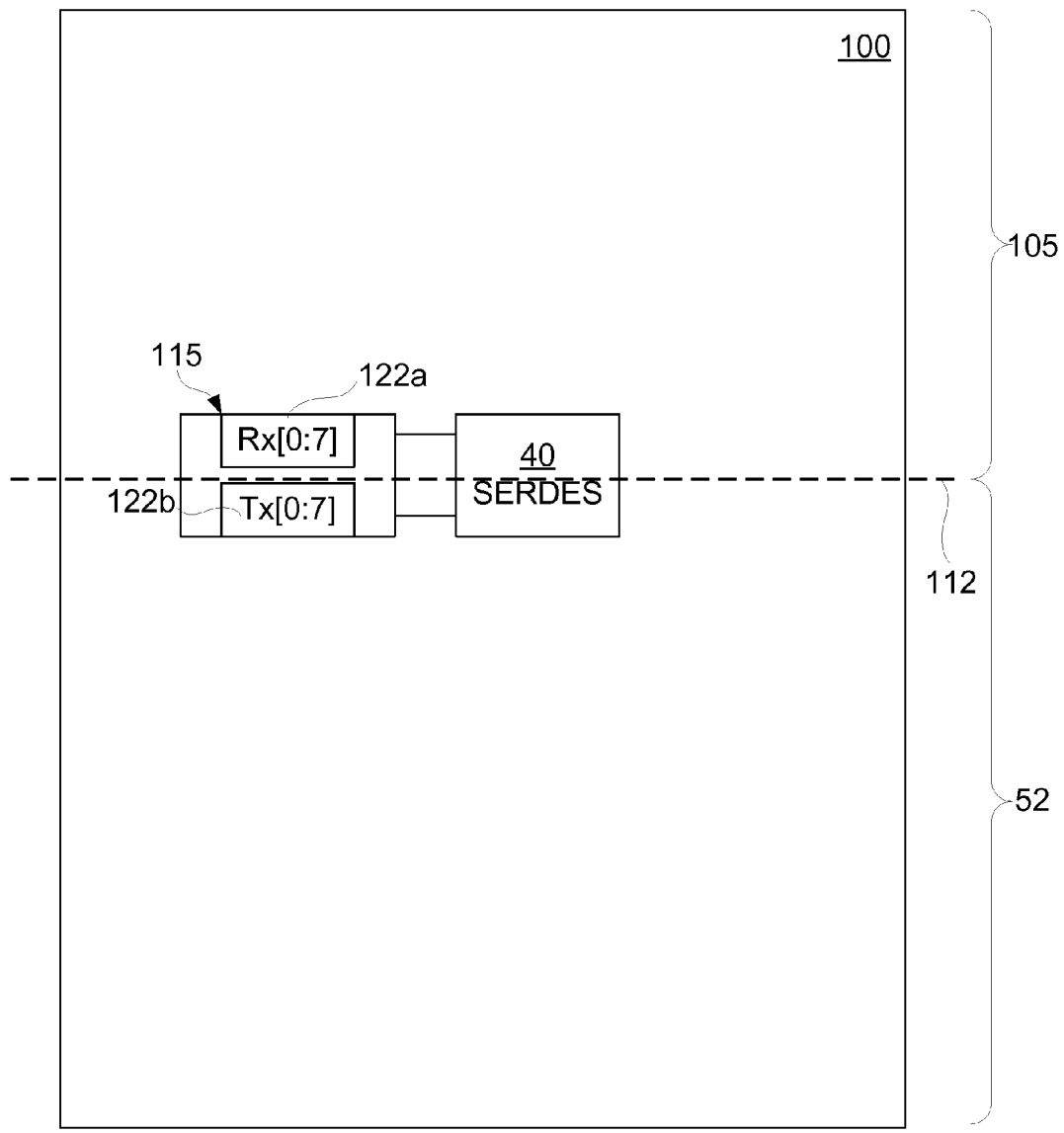
FIG. 1 illustrates a device layout that includes a memory block and a SERDES interface.

The present invention balances the access time and propagation delays for a signal entering a die across all physical corners of the silicon. This is achieved by providing a SERDES interface in the center of the die. FIG. 1 illustrates a die layout of the present invention divided by an axis 112 into an upper partition 50 and a lower partition 52. Each partition of the die layout contains an IP core 10A, 10B that is either a memory array, programmable logic array or network processor block. The memory core 10A, 10B may be either an SRAM, DRAM, 1T-SRAM or Flash. A serial interface 115 is positioned on axis 112 between the two IP cores 10A, 10B with serial interface 115 having Receiver/Transmitter (Rx/Tx) units 122a, 124a/122b, 124b, respectively. In a preferred embodiment, when partitions 50, 52 have an equal area, axis 112 is centrally located on semiconductor die 400. However, in other embodiments, axis 112 can be shifted so that the SERDES interface is positioned off center on die surface 400. The serial interface contains one or more SERDES blocks. The semiconductor die of this invention has multiple metal layers 190, upon which are various circuit patterns.

It is not necessary for the IP cores of the present invention to have the same function or to be limited to memory blocks. In all embodiments, at least one IP core (functional block) is located in each partition. In one embodiment, each partition may constitute an equivalent half, that is, each partition may have the same area. However, it is not necessary that the partitions of the present invention have the same area as illustrated in FIG. 1.

Figure 2:
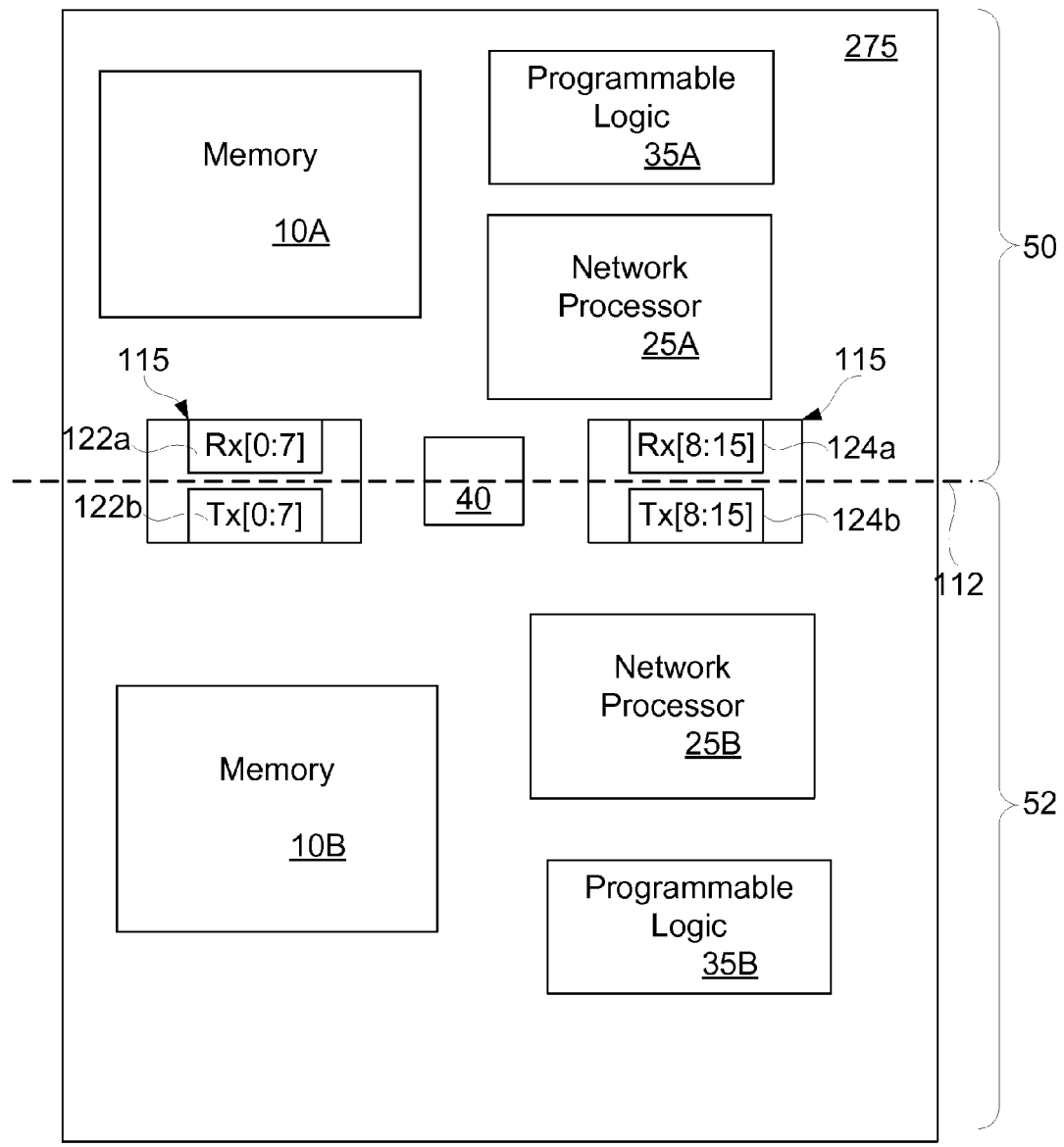
FIG. 2 illustrates a device layout that includes multiple functional blocks and a SERDES interface.

FIG. 2 illustrates an alternate chip layout where partition 50 has a smaller area than partition 52. In FIG. 2 more than two IP cores are arranged on die 275. In the upper partition 50 of substrate 275 is mounted memory core 10A, logic core 35A and network processor 25A. The lower partition 52 of substrate 275 contains memory core 10B, logic core 35B, and network processor 25B. The layout of FIG. 2 also includes a memory access controller and/or error detection software 40. Each pair of IP cores is preferably symmetrically located about axis 112. Along axis 112 is positioned a SERDES interface composed of two SERDES blocks 115.

Each SERDES block 115 contains Rx/Tx unit 122a, 124a/122b, 124b, respectively. Each Tx port in Tx unit 122b, 124b contains a differential pair of transmitters, the transmitter pairs are grouped with the transmitters of the same Tx unit. Each Rx port in Rx unit 122a, 124a contains a differential pair of receivers that are isolated from the Tx ports in Tx unit 122b, 124b. In addition, each Tx port and each Rx port has clocking functionality to implement a PLL circuitry. Although 16 Tx ports and 16 Rx ports are shown, the present invention is also applicable to a SERDES block that has a different number of Tx/Rx ports. Preferably, the Rx ports in Rx units 122a, 124a occupy a portion of the upper partition 50 of the die layout and the Tx ports in Tx unit 122b, 124b occupy a lower partition 52 of the die layout. By placing the SERDES block in approximately the center of the die, the distance of the data access from opposite edges of the die is more uniform than in the prior art. As a result, the layout of the present invention provides a symmetrical or nearly symmetrical point of entry for each data signal.

Figure 3A:
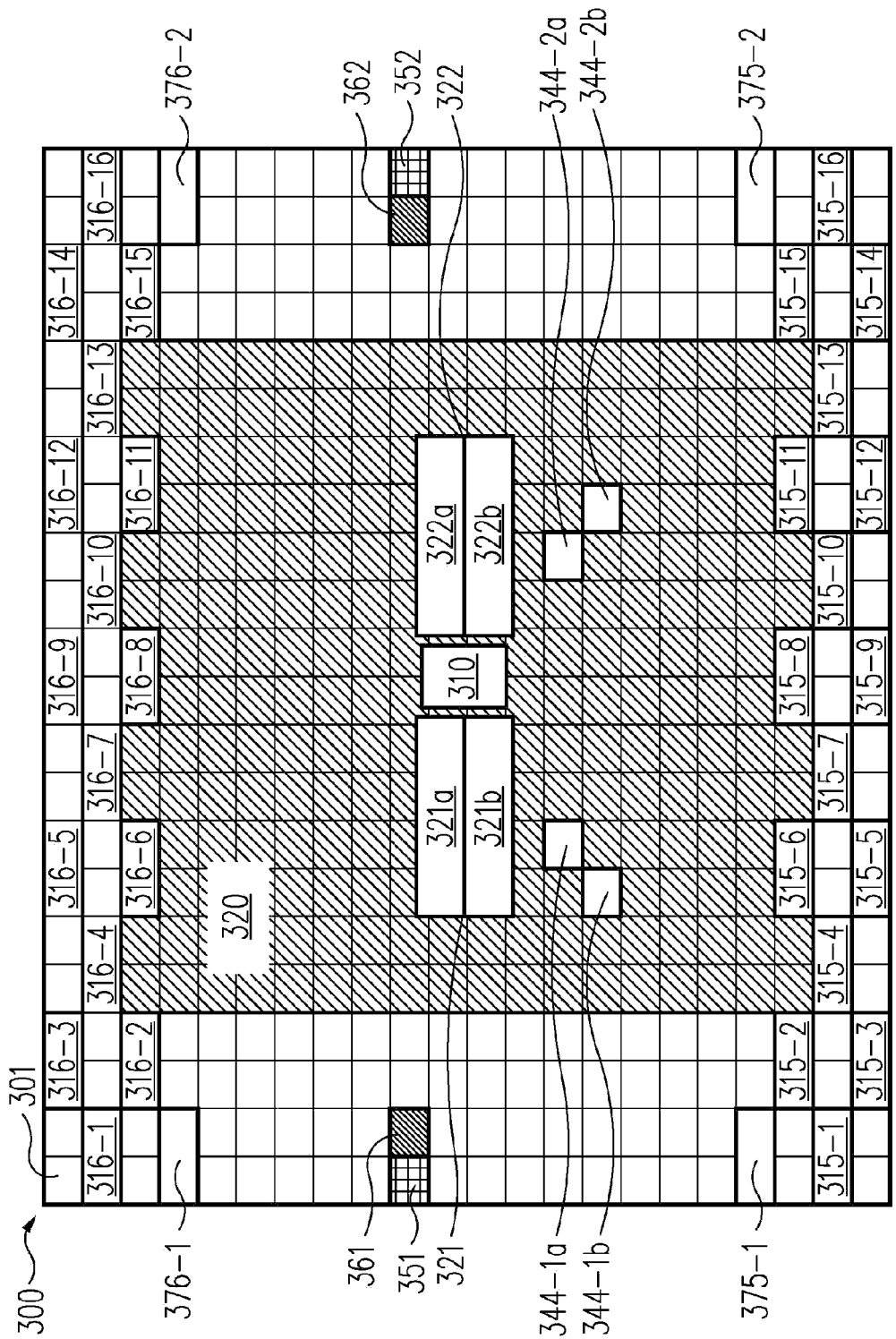
FIG. 3A illustrates a package layout for the embodiment of FIG. 1.

FIG. 3A illustrates a more detailed layout of the invention. Elements 316-1 to 316-16 correspond to Rx terminals, whereas elements 315-1 to 315-16 correspond to Tx terminals. The Tx terminals are separated from the Rx terminals. Terminals refer to nodes on the edge of a package that are coupled to data lines. In addition, the present invention provides connections to Rx/Tx ports inside a serial interface on the die. The ports are equidistant from the four corners of the die substrate to a central region on the die.

FIG. 3A shows the layout of package substrate 300 in an integrated circuit memory device according to some embodiments of the present invention. Package substrate 300 may be divided into a number of divisions 301 forming an M×N matrix. According to the embodiment of FIG. 3A, there are M (=22)×N (=22) divisions 301 in package substrate 300. Other values for M and N may be used instead of a 22×22 matrix. Further, the values of M and N need not be the same. Divisions 301 of package substrate 300 may overlap different area portions of die substrate 400 which may include functional components ("blocks") formed in circuit substrate 400. For example, the divisions in the shaded portion 320 of FIG. 3A may overlap various functional blocks formed in die substrate 400. Such functional blocks may include logic and memory circuits, as well as memory arrays 10A and 10B, coupled to SERDES circuits 115, and CRC circuit 40 of FIG. 1, which shows a layout of die substrate 400. While the embodiment depicted in FIG. 1 includes two memory arrays and two SERDES circuits, some embodiments of the present invention may use a different number of memory arrays and SERDES circuits. The divisions 301 in portion 321 (322) of package substrate 300 overlap first (second) SERDES circuit 115. The divisions 301 in portion 310 of package substrate 300 overlap CRC circuit 40 (FIG. 1), according to the embodiment depicted in FIG. 3A. Specifically, a given division 301 in package substrate 300 may overlap more than one functional component formed in die substrate 400. Also within shaded portion 320, divisions 344-1a (344-2a) and 344-1b (344-2b) may be coupled to conducting balls providing a signal or power to a sensitive circuit like a PLL (phase-locked loop) circuit in substrate 400. Portion 321 (322) may include receiver portion 321a (322a) overlapping receiver unit 122a (124a) in SERDES 115 of FIG. 1. Portion 321 (322) may also include transmitter portion 321b (322b) overlapping transmitter unit 122b (124b) in SERDES 115 of FIG. 1. Outside and along the edges of shaded portion 320 of package substrate 300, according to the embodiment shown in FIG. 3A, portions 315-1 to 315-16 and portions 316-1 to 316-16 may be provided. Portions 315-1 to 315-16 overlap divisions 301 of package substrate 300 that may be coupled to Tx data channels 550-1 to 550-16 of package substrate 300 (see, FIG. 3B) through conducting balls 215, according to some embodiments of the present invention. Portions 316-1 to 316-16 overlap divisions 301 of package substrate 300 coupled to Rx data channels 552-1 to 552-16 (see, FIG. 3B) through conducting balls 216. Some of the divisions (e.g. 351 and 352) in package substrate 300 may be coupled to a biasing voltage for die (circuit) substrate 400, associated with a ground voltage provided through divisions 361 and 362, respectively.

Portion 375-1 (375-2) may be used to provide an extra Tx data channel 551-1 (551-2) (see, FIG. 3B) to integrated circuit 100. Likewise, portions 376-1 (376-2) overlap divisions 301 in package substrate 300 that may provide an extra Rx data channel 553-1 (553-2) (see, FIG. 3B) to integrated circuit 100.

Figure 3B:
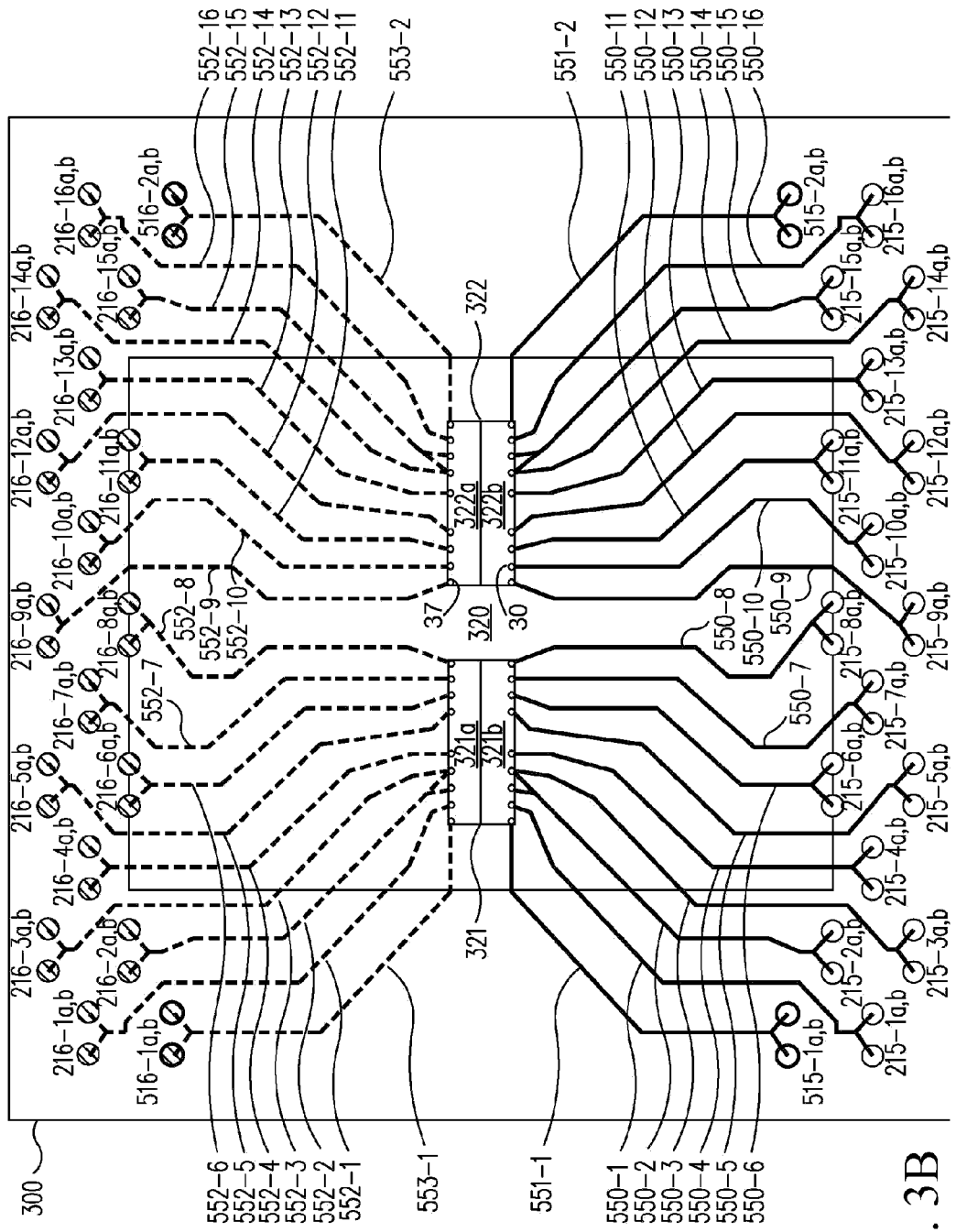
FIG. 3B illustrates the package layout of FIG. 3A with conductor traces.

FIG. 3B is a layout of package substrate 300 showing the positions of conducting balls 215-1a, 215-1b to 215-15a, 215-15b, 216-1a, 216-1b to 216-15a, 216-15b, coupled to package substrate 300. Also shown are conducting balls 515-1a, 515-1b, 515-2a, 515-2b, 516-1a, and 516-1b, and 516-2a, 516-2b coupled to package substrate 300. Also shown in FIG. 3B are Rx data lines 552-1 to 552-16, 553-1 and 553-2, and Tx data lines 550-1 to 550-16, 551-1 and 551-2 in package substrate 300, according to some embodiments of the present invention. By using Tx/Rx data lines in package substrate 300 as shown in FIG. 3B, the latency of a memory array for a data line in a package substrate having a length of approximately 8-10 mm according to the embodiment depicted in FIG. 3B may be less than 100 picoseconds, and more preferably, the latency is less than 70 picoseconds (ps) or less within the package substrate. By comparison, the latency for a Tx/Rx data line in the prior art carrying data signals from one edge of a die to the opposite edge of the die within a silicon substrate may have a latency ten times greater than the present invention, or about 2.4 ns.

In the present invention, a Tx signal will take longer to travel from bump 30 in the serial interface 322b through the die (400 of FIG. 1) to the die edge than to travel from serial interface 322b through the package substrate 300 and out to ball 215-10a, b (which is the edge of the package). In other words, it is faster in the present invention to route a signal through the package than to transport a signal from the serial interface 322b through the die (400 of FIG. 1) out to the edge of the silicon die, and then to travel through the package from the die edge to ball 215-10a, b. Similarly, it is faster to route an Rx signal from the package edge at 216-9a, b through the package substrate 300 to the bump 37 in the serial interface 322a than to travel from ball 216-9a, b to the die edge and then through the die (400 of FIG. 1) to bump 37.

Conducting balls 216-1a,b to 216-16a,b are coupled to Rx data lines 552-1 to 552-16; conducting balls 516-1a,b are coupled to Rx data line 553-1; and conducting balls 516-2a, 516-2b are coupled to Rx data line 553-2. Conducting balls 215-1a, 215-1b to 215-16a, 215-16b are coupled to Tx data lines 550-1 to 550-16; conducting balls 515-1a, 515-1b are coupled to Tx data line 551-1; and conducting balls 515-2a, 515-2b are coupled to Tx data line 551-2. All other elements in FIG. 3B are as described in detail in FIG. 3A above. According to some embodiments of the present invention, Rx data lines 552-1 to 552-16, 553-1, 553-2, and Tx data lines 550-1 to 550-16, 551-1, 551-2 may carry their respective signals as differential signals.

A semiconductor device that contains the layout of the present invention will be referred to in this description as a Bandwidth Engine (BE) device. The problems overcome by adopting the layout of the BE device will be explained in reference to the prior art system of FIGS. 4A and 4B.

Figure 4A:
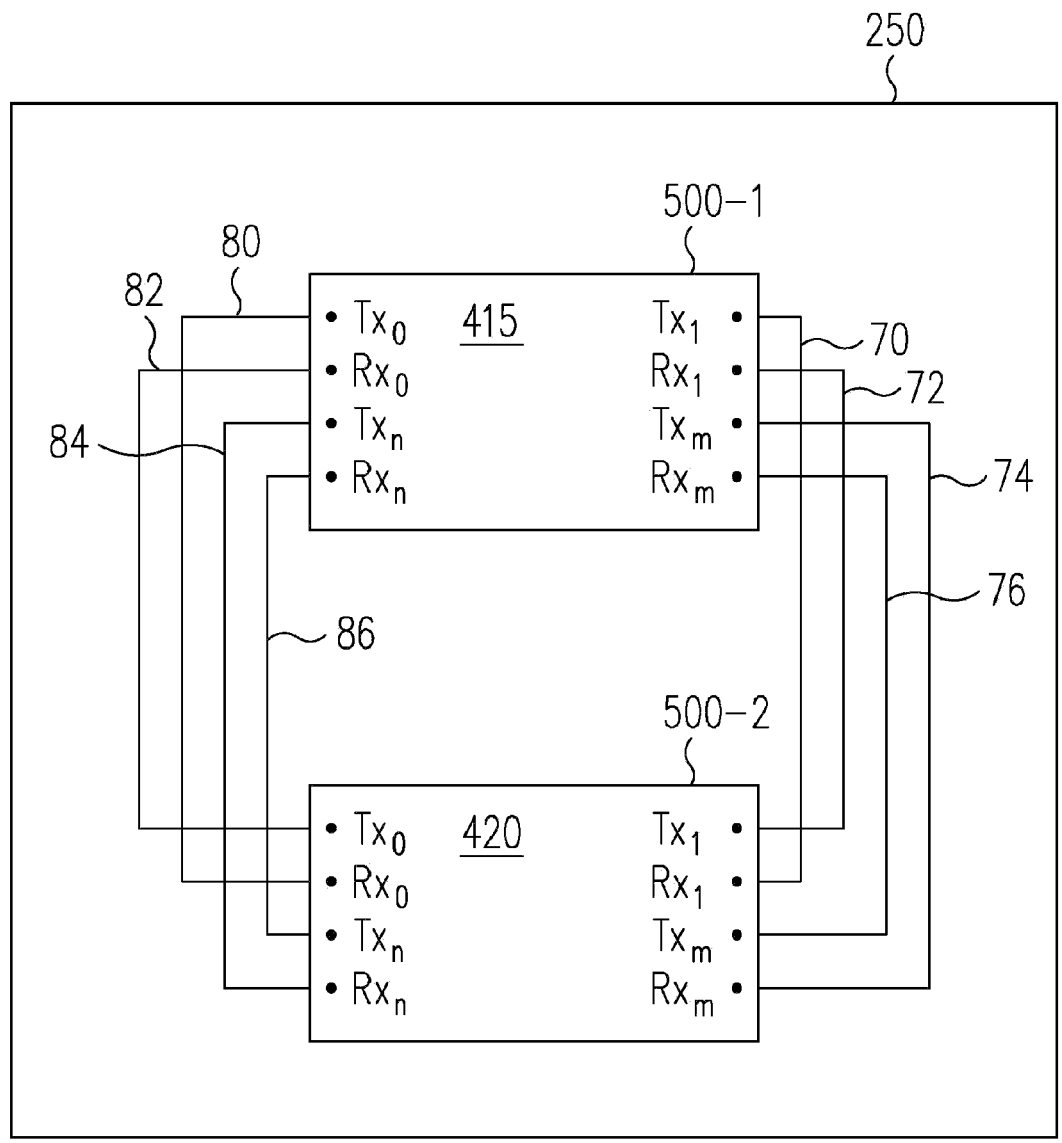
FIG. 4A illustrates a conventional routing pattern for two ICs mounted on a printed circuit board.

FIG. 4A includes two conventional ICs on a board 250. IC 415 is coupled to IC 420. The terminals Tx/Rx of devices 415 and 420 are arranged in pairs on the peripheral edges of their packages. On lateral edges of IC 415, Tx/Rx pairs are $Tx_0/Rx_0$, $Tx_n/Rx_n$ and $Tx_1/Rx_1$, $Tx_m/Rx_m$. IC 420 has a similar arrangement of Tx/Rx pairs, namely, $Tx_0/Rx_0$, $Tx_n/Rx_n$, and $Tx_1/Rx_1$, $Tx_m/Rx_m$.

Data line 70 in FIG. 4A must cross over three data lines 72, 74 and 76 in order to couple $Tx_1$ terminal on IC 415 to $Rx_1$ terminal on IC 420. Similarly, Tx data line 84 must cross over data lines 80 and 82 in order to couple to $Tx_n$ terminal on IC 415 to $Rx_n$ terminal on chip 420. Every data line in FIG. 4A must cross over one or more data lines of an adjacent terminal. Such crossover can lead to noise coupling. The present invention reduces data line cross over by grouping Tx terminals separately from Rx terminals on the lateral edges of a chip and by isolating Tx ports from Rx ports in the serial interface of the chip layout.

Figure 4B:
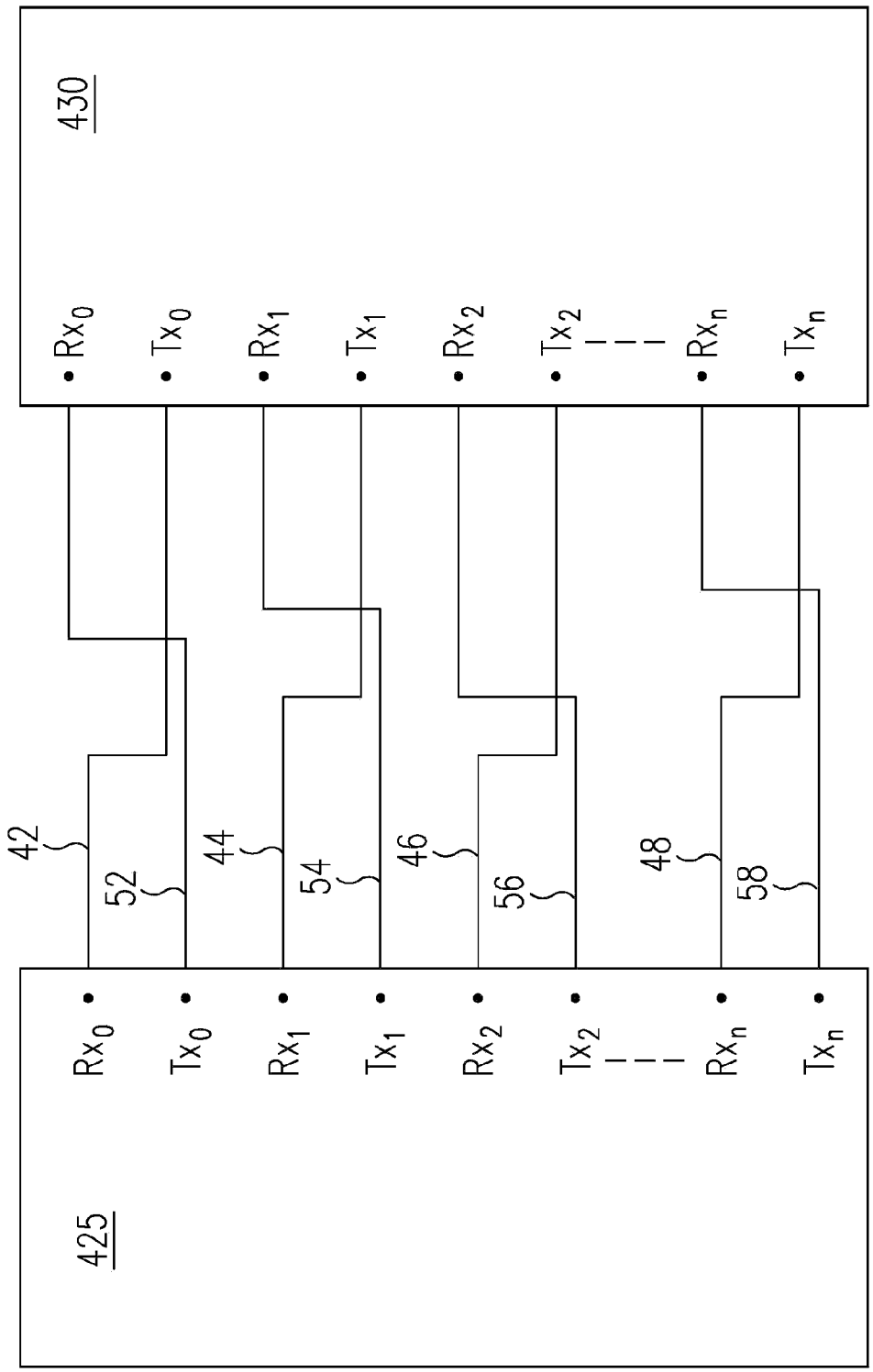
FIG. 4B illustrates the extensive crossover problem that occurs when two conventional chips are positioned next to each other.

FIG. 4B illustrates the extensive crossover problem that occurs when two conventional chips are positioned next to each other. Data lines couple IC 425 to IC 430. Rx data lines 42, 44, 46, 48 in FIG. 4B must cross over an adjacent Tx data line to connect an Rx terminal on IC 425 to a Tx terminal on IC 430. Similarly, Tx data lines 52, 54, 56 and 58 in FIG. 4B must cross over an adjacent Rx data line for a TX terminal on IC 425 to connect to an Rx terminal on IC 430. The problems of FIGS. 4A and 4B are overcome by separating the Rx terminals from the Tx terminals.

Figure 5A:
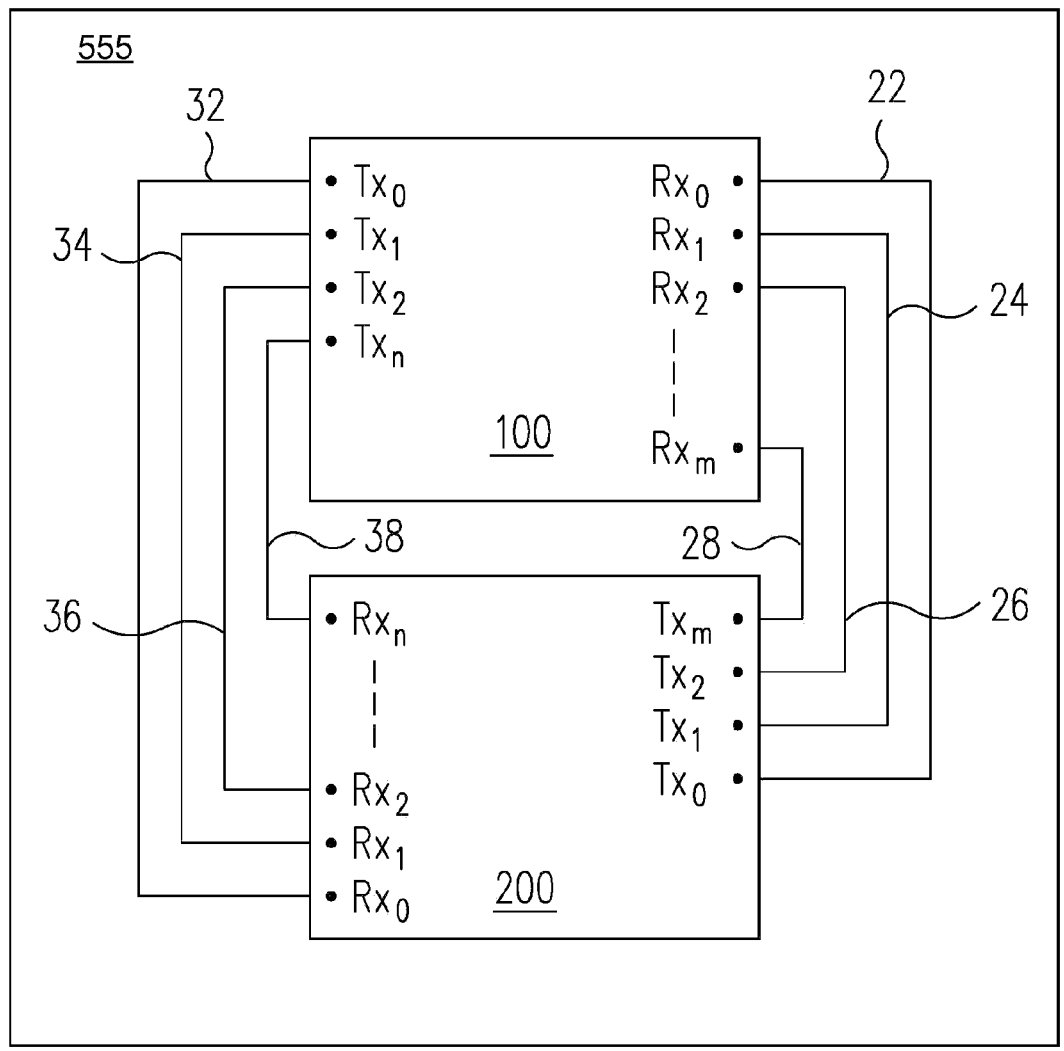
FIG. 5A illustrates a routing pattern for two BE devices mounted on a printed circuit board.

The present invention will be further explained in reference to FIG. 5A. FIG. 5A illustrates two BE devices 100 and 200 on substrate 555. Specifically, chip 100 is shown as positioned above chip 200. The two BE devices are coupled via multiple data lines 32-38 and 22-28. For simplicity, data lines originating from Rx terminal on chip 100 are referred to as Rx data lines, and data lines originating from Tx terminals on chip 100 are referred to as Tx data lines. Tx terminals ($Tx_0$, $Tx_1$, $Tx_2$, ... $Tx_n$) on chip 100 are isolated from Rx terminals ($Rx_0$, $Rx_1$, $Rx_2$, ... $Rx_m$). Similarly, Tx terminals ($Tx_0$, $Tx_1$, $Tx_2$, ... $Tx_m$) on chip 200 are isolated from Rx terminals on the same chip ($Rx_0$, $Rx_1$, $Rx_2$, ... $Rx_n$). Data line 22 is shown connected at one end to $Rx_0$ terminal 14 of chip 100, and at the other end to chip 200 via $Tx_0$ terminal. In operation, each Tx terminal $Tx_0$, $Tx_1$, $Tx_2$, ... $Tx_n$ of device 100 serializes and transmits a serial data signal for output on a Tx data line to an IP core on device 200. Meanwhile, each Rx terminal $Rx_0$, $Rx_1$, $Rx_2$, ... $Rx_m$ on device 100 receives and deserializes a serial data signal for input on an Rx data line to an IP core on device 100. Data line 32 couples $Tx_0$ terminal on chip 100 to $Rx_0$ terminal on chip 200. Thus, Rx terminals ($Rx_0$, $Rx_1$, $Rx_2$, ... $Rx_m$ and $Rx_0$, $Rx_1$, $Rx_2$, ... $Rx_m$) are segregated from Tx terminals ($Tx_0$, $Tx_1$, $Tx_2$, ... $Tx_m$ and $Tx_0$, $Tx_1$, $Tx_2$, ... $Tx_m$) on their respective chips. This segregation results in Tx data lines 32, 34, 36, 38 on chip 100 being nonadjacent to Rx data lines 22, 24, 26, 28 on chip 200. In addition, none of the Rx data lines need to cross over any other data line, including Tx data lines. Consequently, the layout of the Tx data lines and Rx data lines produces a simplified routing pattern. Further, by isolating the Tx terminals from Rx terminals as shown in FIG. 5A package 555 may include fewer routing layers. Since the Rx terminals are radially separated from the Tx terminals their respective data lines may traverse through the same routing layer. Alternatively, the latency advantages of the invention can also be attained by having Rx data lines traverse through a first routing layer and Tx data lines traverse through a second routing layer different from the first routing layer. The total number of package substrate layers will vary depending on the number of power and ground layers needed for the particular product that incorporates the devices of the present invention.

Figure 5B:
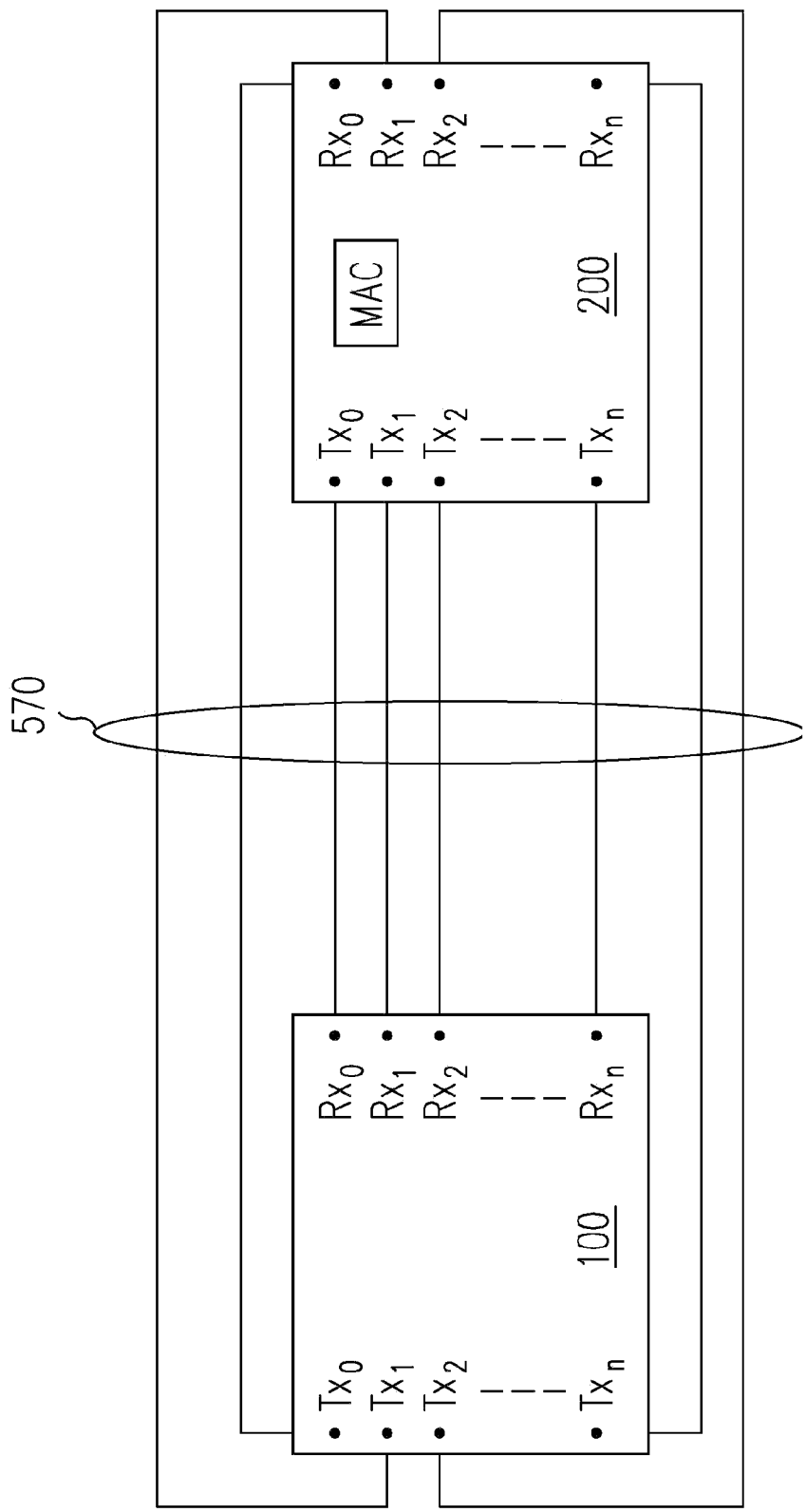
FIG. 5B illustrates an alternative routing pattern for two BE devices mounted on a printed circuit board.

The present invention may also be implemented by positioning chip 100 on either side of chip 200. For example, FIG. 5B illustrates an alternative embodiment in which chip 200 is positioned to the right of chip 100. Chip 100 is an IC device with Rx and Tx terminals grouped around a central axis (an example of Chip 100 is a BE device, however, Chip 100 need not necessarily be restricted to that of a BE device), while chip 200 may be either a BE device or a BE-compliant device. In FIG. 5B, chip 200 is a BE-compliant device and is shown with a memory access controller (MAC). In the configuration of FIG. 5B, none of data lines 570 cross over any other data line. As a result, parallel crosstalk is substantially reduced in the present invention, which enables Tx data lines and Rx data lines to be provided in a single routing layer. The IC device architecture of the present invention also benefits systems that contain devices with an architecture dissimilar to the IC devices of the present invention as will become obvious in reference to FIGS. 6A and 6B.

Figure 6A:
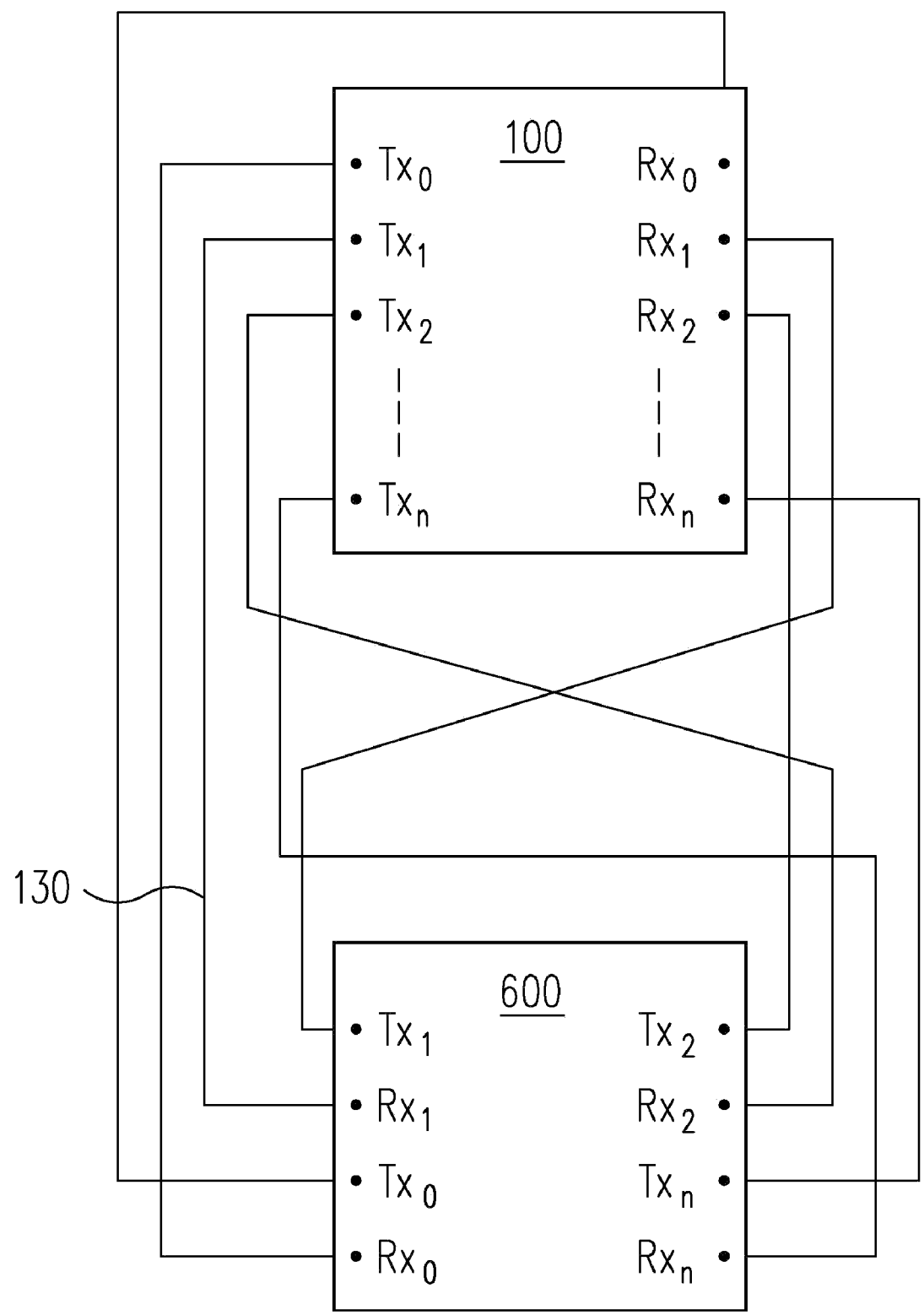
FIG. 6A illustrates a routing pattern of a BE device coupled to a conventional device on a printed circuit board with a minimal amount of crossover.
Figure 6B:
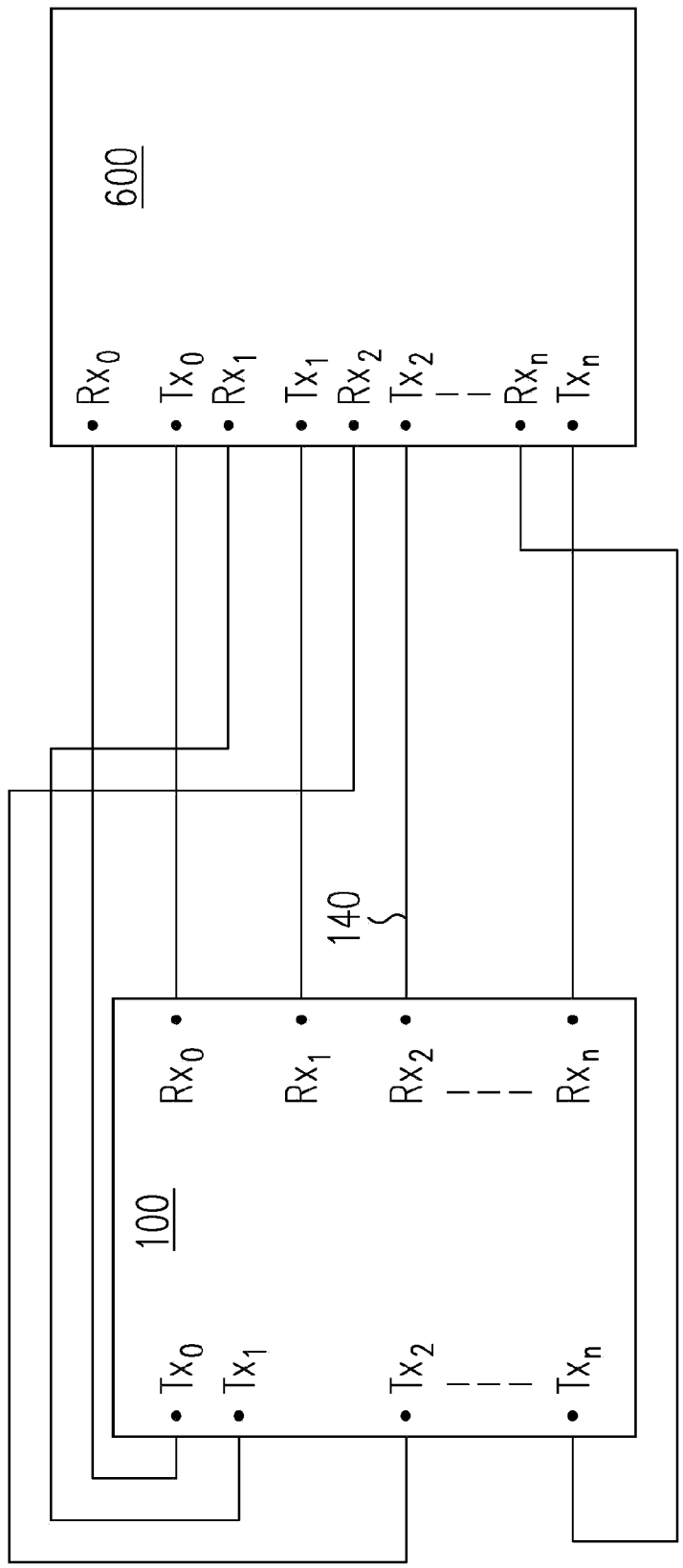
FIG. 6B illustrates an alternative routing pattern for the two devices of FIG. 6A.

FIG. 6A illustrates a BE device 100 coupled to IC 600 on board 150. IC 600 is a conventional IC device that does not have Tx/Rx terminals segregated in accordance with the present invention. FIG. 6B illustrates a conventional IC 600 positioned next to a BE device 100. Unlike FIGS. 5A and 5B, the system of FIGS. 6A and 6B contain at least one data line (130 and 140 respectively) that does not cross over an adjacent data line. Thus, Tx data lines in FIGS. 5A and 5B cross over only a minimal number of Rx data lines. Therefore when a BE device is coupled to a conventional chip the signal and data routing patterns are also improved over the prior art.

Figure 7:
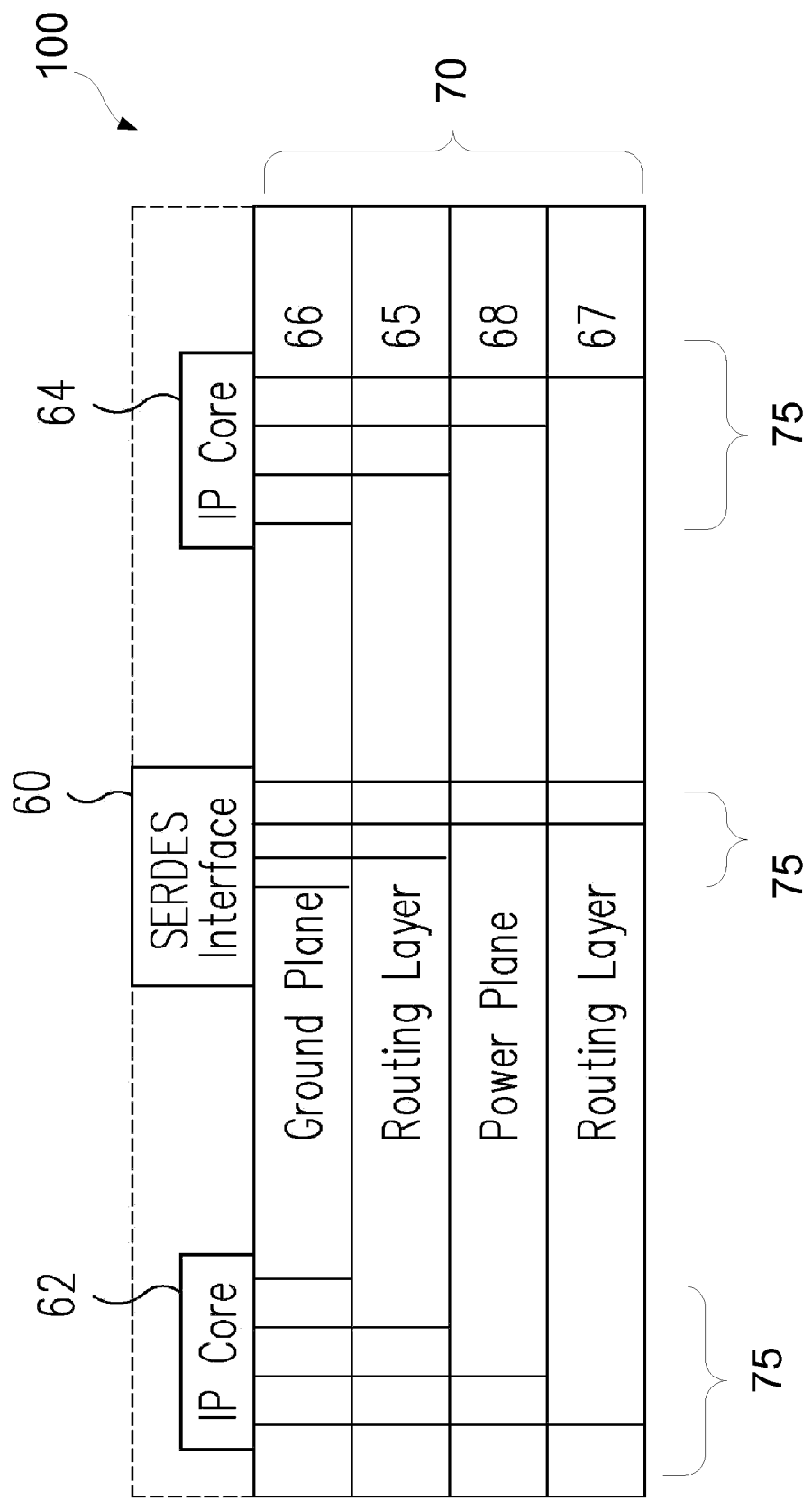
FIG. 7 illustrates a cross section of a semiconductor package of the present invention.
Figure 8:
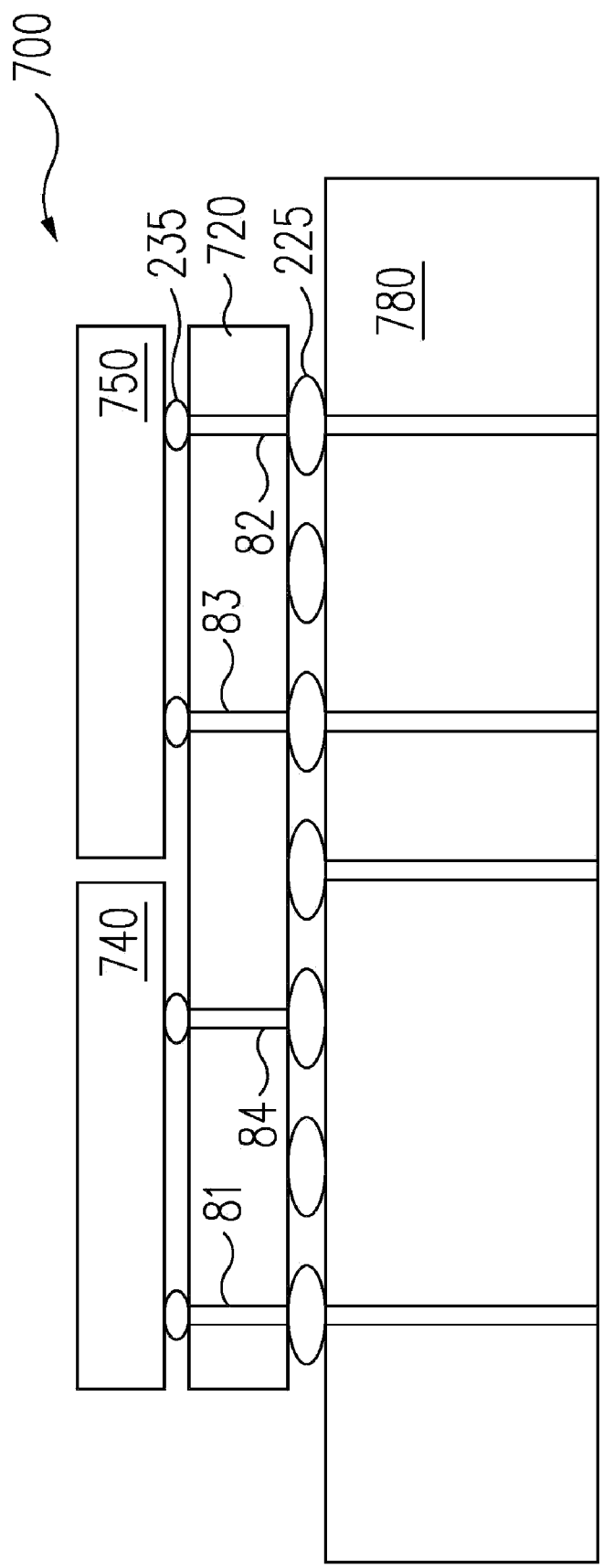
FIG. 8 illustrates a cross section of a stacked die assembly in accordance with one embodiment of the invention.

FIG. 7 illustrates a cross section of a package containing a multi-layer PCB and suitable functional blocks. SERDES interface 60 lies on the central axis, and is flanked by IP core 62 and IP core 64. Unlike the present invention, conventional packages contain anywhere from eight or more layers. In the present invention, BE device 100 has a PCB 70 that may contain as few as four layers since the signals over the Rx data lines are less likely to interfere with signals being transmitted over a Tx data line. In FIG. 7, PCB 70 includes a ground plane 66, power plane 68 and two routing layers 65, 67. Vias 75 couple the terminals on the upper surface of the package to routing layers 65 and 67. The chip layout of the present invention is also advantageous in a stacked die assembly. FIG. 8 illustrates one example of such an assembly. Package 700 is shown as including a BE device 720, which may be an ASIC. BE device 720 is connected to substrate 780 through balls 225. An adhesive is applied to second and third dies 740, 750 respectively to mount the dies to BE device 720. In a less preferred embodiment, dies 740, 750 may be wire bonded to BE device 720. Wirebonding is a less preferred way of connecting the stack because it will increase the propagation delay of the signals. Both dies 740 and 750 are coupled to BE device 720 through bumps 235, while BE device 720 is coupled to substrate 780 through conducting balls 225. Vias 81-84 in BE 720 allow IC 720 to communicate with dies 740 and 750. Similarly, substrate 780 is provided with conducting balls 311 that attach to a PCB. Dies 740 and 750 may contain either an ASIC, FPGA, CPU memory, or logic. Alternatively, dies 740 and 750 may have identical functions that provide BE device 720 with a new feature or an expanded memory capacity.

Figure 9:
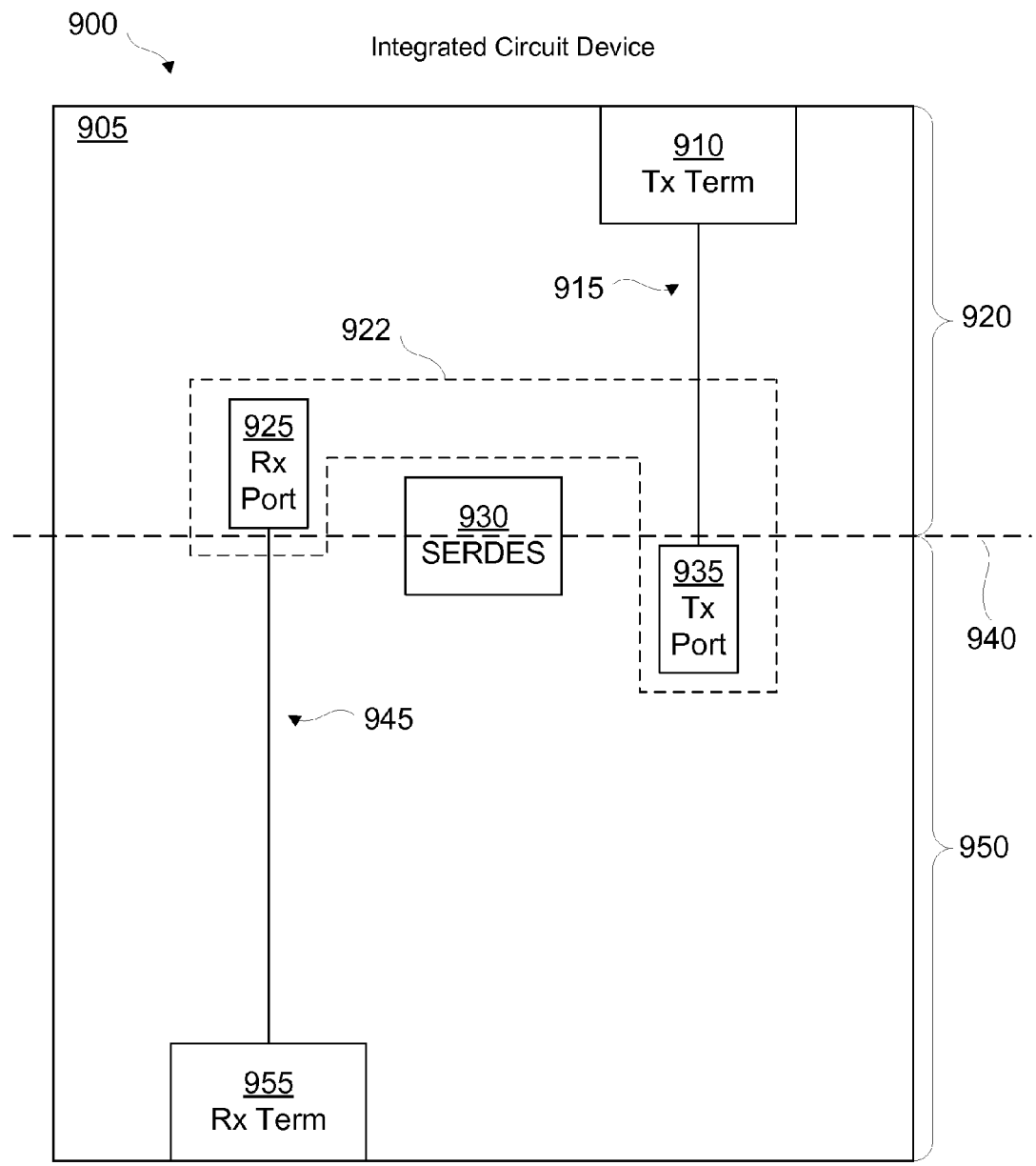
FIG. 9 illustrates an integrated circuit device, in accordance with an embodiment of the present invention.

FIG. 9 illustrates an integrated circuit device 900, in accordance with an embodiment of the present invention. The integrated circuit device 900 includes a semiconductor die 905 divided into a portion 920 and a portion 950 by a central axis 940. The semiconductor die 905 includes a serializer-deserializer circuit (SERDES) 930 which is centrally positioned on the semiconductor 905, a receiver port (Rx port) 925 for the SERDES 930, and a transmitted port (Tx port) 935 for the SERDES 930. Each of the Rx port 925 and the Tx port 935 are coupled to the SERDES 930. As illustrated in FIG. 9, the central axis 940 passes through the SERDES 930 such that a portion of the SERDES is in the portion 920 of the semiconductor die 905 and a portion 950 of the SERDES is in the portion 950 of the semiconductor die 905. The semiconductor die 905 includes Tx terminals 910 in the portion 920 of the semiconductor die 905 and Rx terminals 955 in the portion 950 of the semiconductor die 905. Additionally, the semiconductor die 905 includes Tx data lines 915 connected to the Tx port 935 and the Tx terminals 910 as well as Rx data lines 945 connected to the Rx port 925 and the Rx terminals 955.

As illustrated in FIG. 9, the Rx data lines 945 are located partially in the portion 920 of the semiconductor die 905 and partially in the portion 950 of the semiconductor die 905. Moreover, the Tx data lines 915 are located partially in the portion 920 of the semiconductor die 905 and partially in the portion 950 of the semiconductor die 905. In this way, the Rx data lines 945 and the Tx data lines are staggered about the central axis 940. As may be envisioned from FIG. 9, the SERDES 930 has a width perpendicular to the central axis 940 which defines a width of an overlap region extending across the semiconductor die 905 along the central axis 940. In various embodiments, the Rx data lines 945 are located partially in the overlap region and partially in the portion 950 of the semiconductor die 905, and the Tx data lines 915 are located partially in the portion 920 of the semiconductor die 905 and partially in the overlap region.

In the embodiment of FIG. 9, the Rx port 925 and the Tx port 935 are separated by the SERDES 930 and in combination form a serial interface 922 for the SERDES 930. In other embodiments, the semiconductor die 905 may include more than one Rx port 925 and more than one Tx port 935 such that the Rx ports 925 and the Tx ports 935 are separated by the SERDES 930. In these embodiments, the Rx ports 925 are adjacent to each other and the Tx ports 935 are adjacent to each other. Moreover, each Rx port 925 in combination with a corresponding Tx port 935 forms a serial interface 922 for the SERDES 930. Although the semiconductor die 905 illustrated in FIG. 9 includes only one serial interface 922 for the SERDES 930, the semiconductor die 905 may include any number of serial interfaces 922 in other embodiments.

Figure 10:
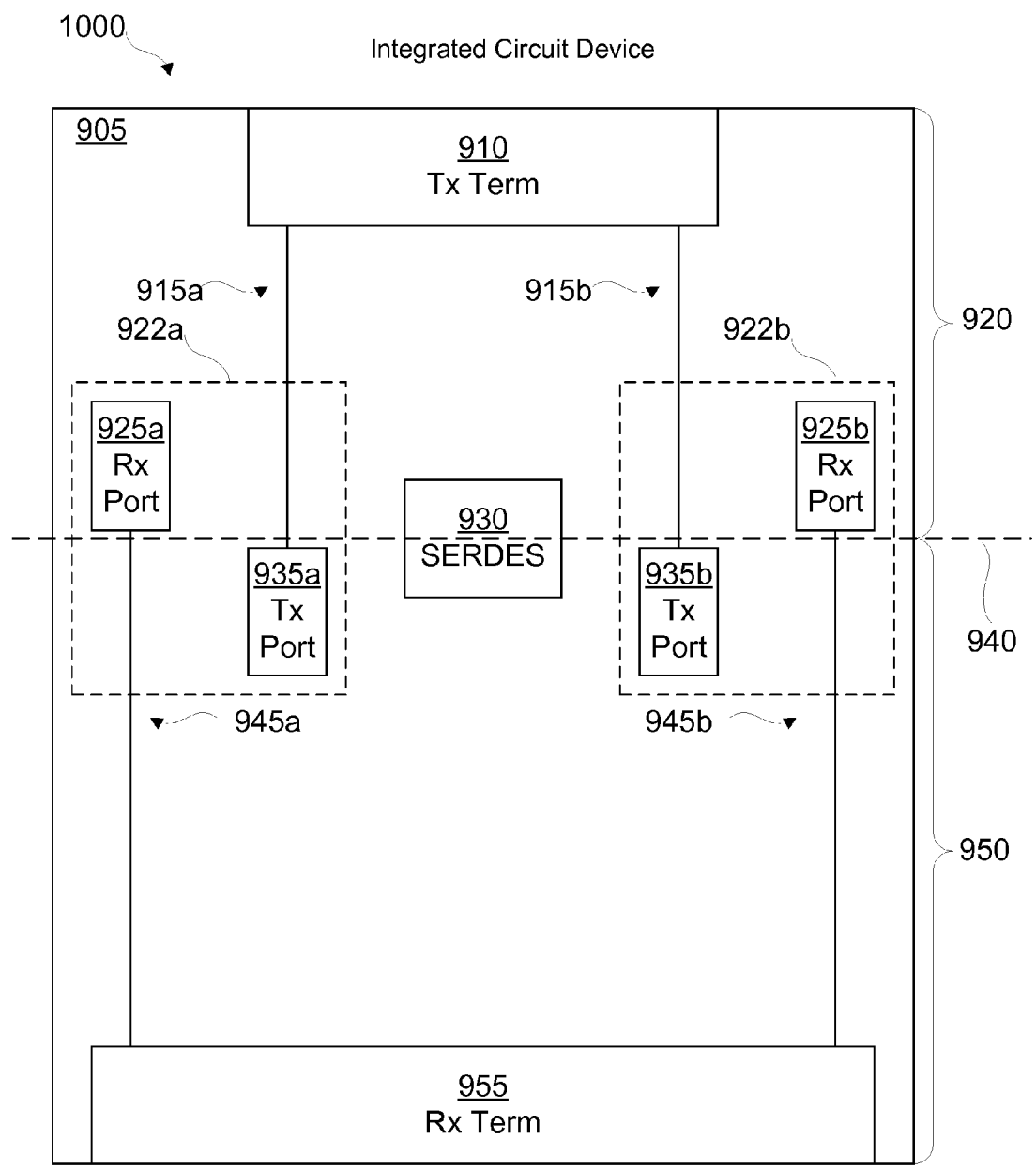
FIG. 10 illustrates an integrated circuit device, in accordance with an embodiment of the present invention.

FIG. 10 illustrates an integrated circuit device 1000, in accordance with an embodiment of the present invention. The integrated circuit device 1000 includes a semiconductor die 905 divided into a portion 920 and a portion 950 by a central axis 940. The semiconductor die 905 includes a serializer-deserializer circuit (SERDES) 930 which is centrally positioned on the semiconductor 905, receiver ports 925 (e.g., Rx ports 925a and 925b) for the SERDES 930, and transmitter ports 935 (e.g., Tx ports 935a and 935b) for the SERDES 930. Each of the Rx ports 925 and the Tx ports 935 are coupled to the SERDES 930. As illustrated in FIG. 9, the central axis 940 passes through the SERDES 930 such that a portion of the SERDES is in the portion 920 of the semiconductor die 905 and a portion 950 of the SERDES is in the portion 950 of the semiconductor die 905. The semiconductor die 905 includes Tx terminals 910 in the portion 920 of the semiconductor die 905 and Rx terminals 955 in the portion 950 of the semiconductor die 905. Additionally, the semiconductor die 905 includes Tx data lines 915 (e.g., Tx data lines 915a and 915b) connected to the Tx ports 935 and the Tx terminals 910 as well as Rx data lines 945 (e.g., Rx data lines 945a and 945b) connected to the Rx ports 925 and the Rx terminals 955.

As illustrated in FIG. 10, the Rx data lines 945 are located partially in the portion 920 of the semiconductor die 905 and partially in the portion 950 of the semiconductor die 905. Moreover, the Tx data lines 915 are located partially in the portion 920 of the semiconductor die 905 and partially in the portion 950 of the semiconductor die 905. In this way, the Rx data lines 945 and the Tx data lines are staggered about the central axis 940. As may be envisioned from FIG. 10, the SERDES 930 has a width perpendicular to the central axis 940 which defines a width of an overlap region extending across the semiconductor die 905 along the central axis 940. In various embodiments, the Rx data lines 945 are located partially in the overlap region and partially in the portion 950 of the semiconductor die 905, and the Tx data lines 915 are located partially in the portion 920 of the semiconductor die 905 and partially in the overlap region.

In the embodiment of FIG. 10, each Rx port 925 is adjacent to corresponding Tx port 935 and in combination with the corresponding Tx port 935 forms a serial interface 922 (e.g. serial interfaces 922a and 922b) for the SERDES 930. Moreover, the Rx ports 925 are separated from each other by one or more Tx ports 935 or the SERDES 930, and the Tx ports 935 are separated from each other by one or more Rx ports 925 or the SERDES 930. Although the semiconductor die 905 illustrated in FIG. 10 includes two serial interfaces 922 for the SERDES 930, the semiconductor die 905 may include any number of serial interfaces 922 in other embodiments.

Figure 11:
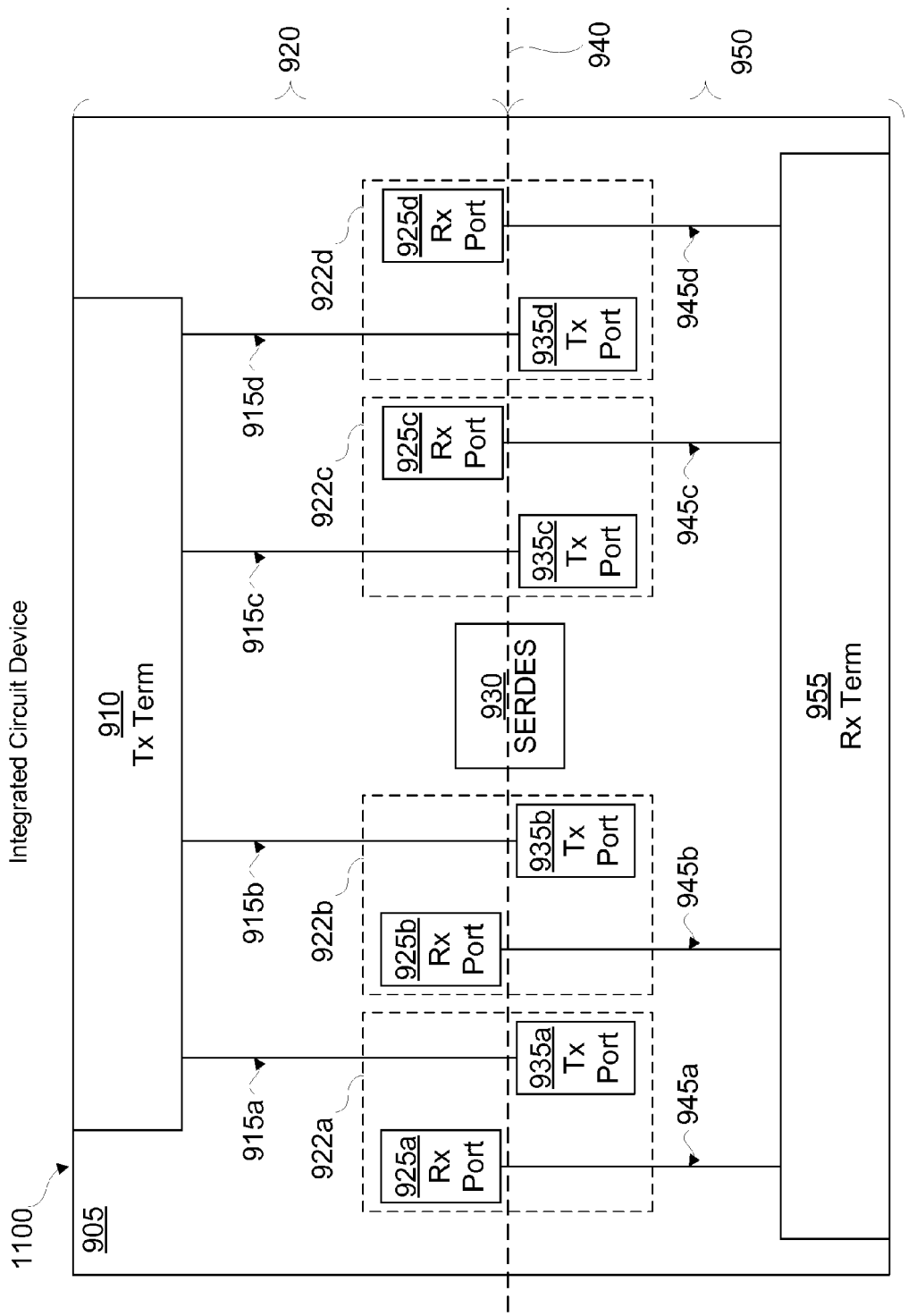
FIG. 11 illustrates an integrated circuit device, in accordance with an embodiment of the present invention.

FIG. 11 illustrates an integrated circuit device 1100, in accordance with an embodiment of the present invention. The integrated circuit device 1100 includes a semiconductor die 905 divided into a portion 920 and a portion 950 by a central axis 940. The semiconductor die 905 includes a serializer-deserializer circuit (SERDES) 930 which is centrally positioned on the semiconductor 905, receiver ports 925 (e.g., Rx ports 925a and 925b) for the SERDES 930, and transmitter ports 935 (e.g., Tx ports 935a and 935b) for the SERDES 930. Each of the Rx ports 925 and the Tx ports 935 are coupled to the SERDES 930. As illustrated in FIG. 9, the central axis 940 passes through the SERDES 930 such that a portion of the SERDES is in the portion 920 of the semiconductor die 905 and a portion 950 of the SERDES is in the portion 950 of the semiconductor die 905. The semiconductor die 905 includes Tx terminals 910 in the portion 920 of the semiconductor die 905 and Rx terminals 955 in the portion 950 of the semiconductor die 905. Additionally, the semiconductor die 905 includes Tx data lines 915 (e.g., Tx data lines 915a and 915b) connected to the Tx ports 935 and the Tx terminals 910 as well as Rx data lines 945 (e.g., Rx data lines 945a and 945b) connected to the Rx ports 925 and the Rx terminals 955.

As illustrated in FIG. 11, the Rx data lines 945 are located partially in the portion 920 of the semiconductor die 905 and partially in the portion 950 of the semiconductor die 905 Moreover, the Tx data lines 915 are located partially in the portion 920 of the semiconductor die 905 and partially in the portion 950 of the semiconductor die 905. In this way, the Rx data lines 945 and the Tx data lines are staggered about the central axis 940. As may be envisioned from FIG. 11, the SERDES 930 has a width perpendicular to the central axis 940 which defines a width of an overlap region extending across the semiconductor die 905 along the central axis 940. In various embodiments, the Rx data lines 945 are located partially in the overlap region and partially in the portion 950 of the semiconductor die 905, and the Tx data lines 915 are located partially in the portion 920 of the semiconductor die 905 and partially in the overlap region.

In the embodiment of FIG. 11, each Rx port 925 is adjacent to corresponding Tx port 935 and in combination with the corresponding Tx port 935 forms a serial interface 922 (e.g. serial interfaces 922a, 922b, 922c, and 922d) for the SERDES 930. Moreover, the Rx ports 925 are separated from each other by one or more Tx ports 935 or the SERDES 930, and the Tx ports 935 are separated from each other by one or more Rx ports 925 or the SERDES 930. Although the semiconductor die 905 illustrated in FIG. 11 includes four serial interfaces 922 for the SERDES 930, the semiconductor die 905 may include any number of serial interfaces 922 in other embodiments.

Figure 12:
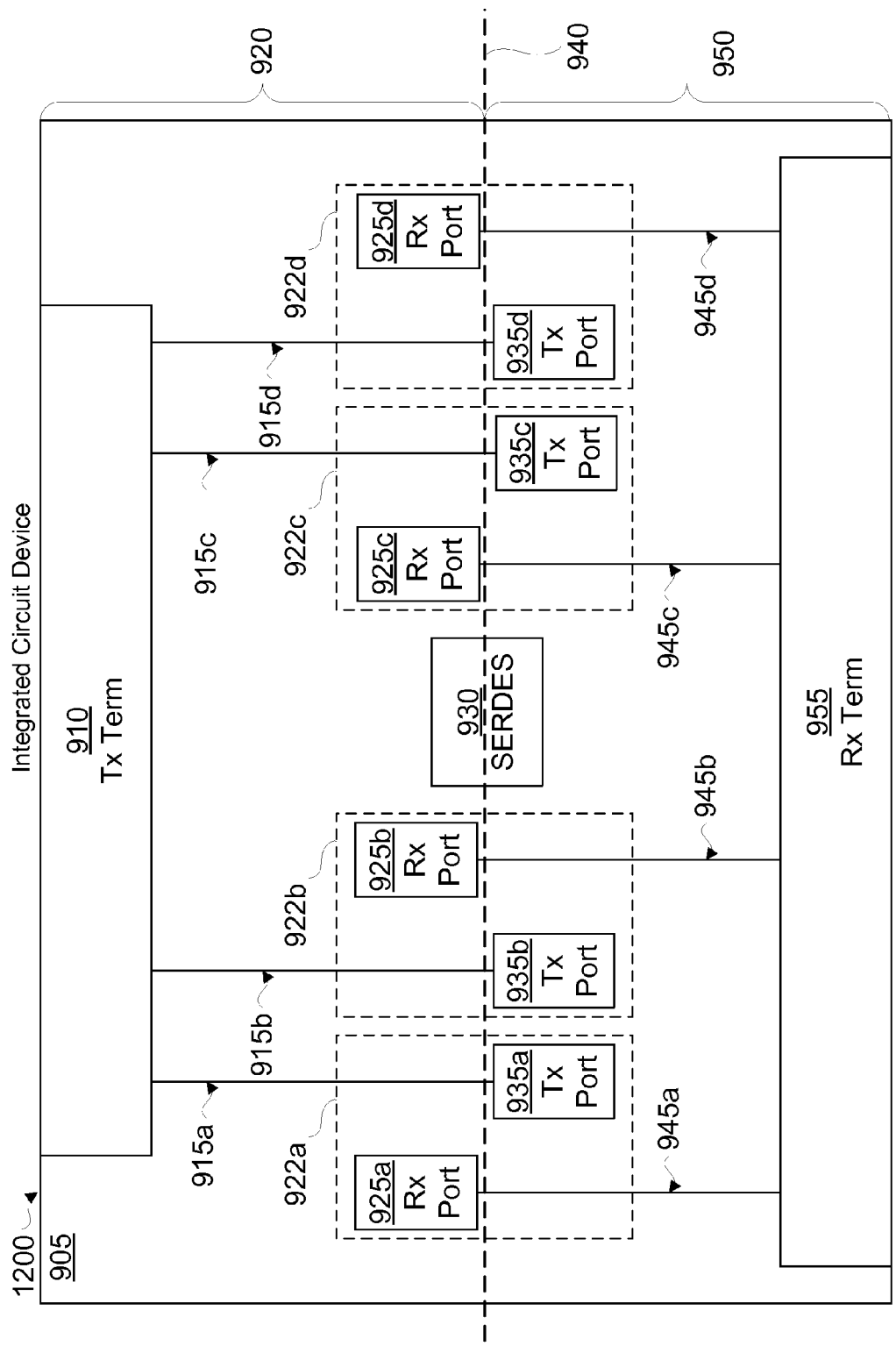
FIG. 12 illustrates an integrated circuit device, in accordance with an embodiment of the present invention.

FIG. 12 illustrates an integrated circuit device 1200, in accordance with an embodiment of the present invention. The integrated circuit device 1200 includes a semiconductor die 905 divided into a portion 920 and a portion 950 by a central axis 940. The semiconductor die 905 includes a serializer-deserializer circuit (SERDES) 930 which is centrally positioned on the semiconductor 905, receiver ports 925 (e.g., Rx ports 925a and 925b) for the SERDES 930, and transmitter ports 935 (e.g., Tx ports 935a and 935b) for the SERDES 930. Each of the Rx ports 925 and the Tx ports 935 are coupled to the SERDES 930. As illustrated in FIG. 9, the central axis 940 passes through the SERDES 930 such that a portion of the SERDES is in the portion 920 of the semiconductor die 905 and a portion 950 of the SERDES is in the portion 950 of the semiconductor die 905. The semiconductor die 905 includes Tx terminals 910 in the portion 920 of the semiconductor die 905 and Rx terminals 955 in the portion 950 of the semiconductor die 905. Additionally, the semiconductor die 905 includes Tx data lines 915 (e.g., Tx data lines 915a and 915b) connected to the Tx ports 935 and the Tx terminals 910 as well as Rx data lines 945 (e.g., Rx data lines 945a and 945b) connected to the Rx ports 925 and the Rx terminals 955.

As illustrated in FIG. 12, the Rx data lines 945 are located partially in the portion 920 of the semiconductor die 905 and partially in the portion 950 of the semiconductor die 905. Moreover, the Tx data lines 915 are located partially in the portion 920 of the semiconductor die 905 and partially in the portion 950 of the semiconductor die 905. In this way, the Rx data lines 945 and the Tx data lines are staggered about the central axis 940. As may be envisioned from FIG. 12, the SERDES 930 has a width perpendicular to the central axis 940 which defines a width of an overlap region extending across the semiconductor die 905 along the central axis 940. In various embodiments, the Rx data lines 945 are located partially in the overlap region and partially in the portion 950 of the semiconductor die 905, and the Tx data lines 915 are located partially in the portion 920 of the semiconductor die 905 and partially in the overlap region.

In the embodiment of FIG. 12, each Rx port 925 is adjacent to corresponding Tx port 935 and in combination with the corresponding Tx port 935 forms a serial interface 922 (e.g. serial interfaces 922a, 922b, 922c, and 922d) for the SERDES 930. Moreover, the Tx port 935 of each serial interface 922 is adjacent to the Tx port of an adjacent serial interface 922. In other embodiments, the Rx port 925 of each serial interface 922 is adjacent to the Rx port 925 of an adjacent serial interface 922. In various embodiments, the Tx port 935 of each serial interface 922 is not adjacent to an Rx port 925 of any adjacent serial interface 922. Although the semiconductor die 905 illustrated in FIG. 12 includes four serial interfaces 922 for the SERDES 930, the semiconductor die 905 may include any number of serial interfaces 922 in other embodiments.

Figure 13A:
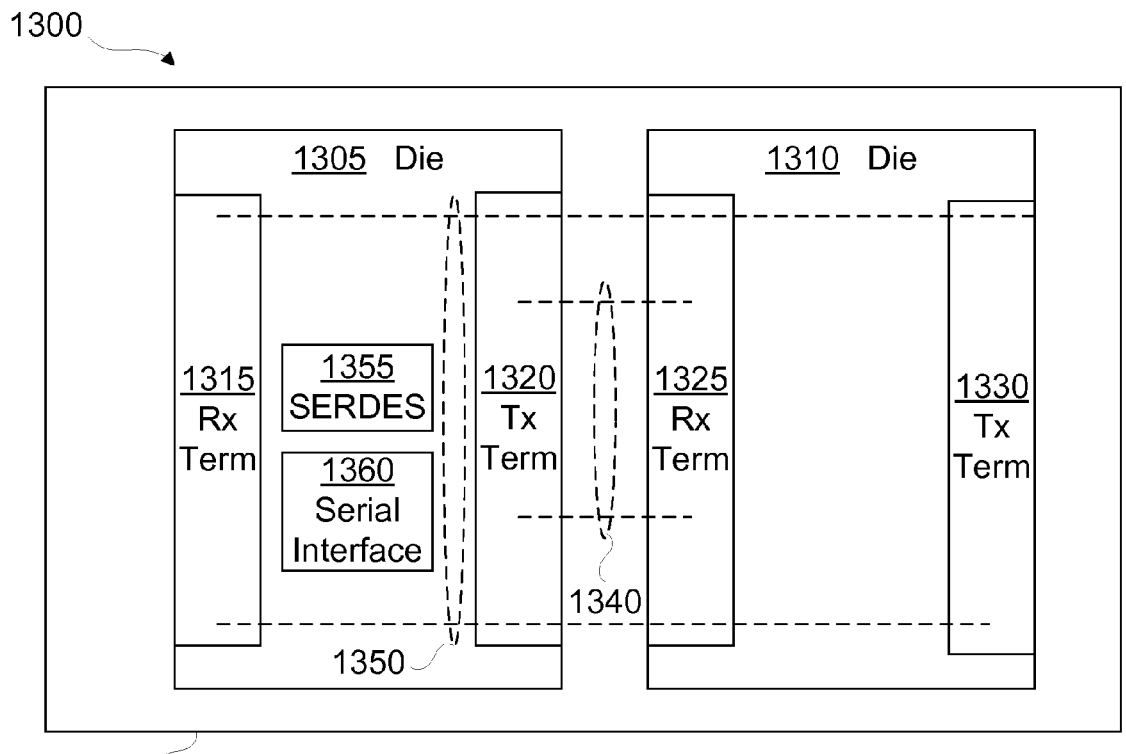
FIG. 13A illustrates an integrated circuit device, in accordance with an embodiment of the present invention.

FIG. 13A illustrates an integrated circuit device 1300, in accordance with an embodiment of the present invention. The integrated circuit device 1300 includes a semiconductor die 1305 and a semiconductor die 1310, each of which is disposed on a layer 1335. The semiconductor die 1305 includes receiver terminals (Rx terminals) 1315 and Tx terminals 1320. The semiconductor die 1310 includes Rx terminals 1325 and Tx terminals 1330. The Tx terminals 1320 of the semiconductor die 1305 are connected to the Rx terminals 1325 of the semiconductor die 1310 through Tx data lines 1340. The Rx terminals 1315 of the semiconductor die 1305 is connected to the Tx terminals 1330 of the semiconductor die 1310 through Rx data lines 1350. In some embodiments, the semiconductor die includes a SERDES 1355 centrally positioned on the semiconductor die 1305 and one or more serial interfaces 1360 connected to the SERDES 1335, the Rx terminals 1315, and the Tx terminals 1330. In the integrated circuit device 1300 illustrated in FIG. 13A, connections between the serial interfaces 1360 and the SERDES 1335, the Rx terminals 1315, and the Tx terminals 1330 are omitted to provide clarity for other features illustrated in FIG. 13A. In various embodiments, the layer 1335 may be a layer of a printed circuit board, a layer of a line card, a semiconductor substrate, a layer formed on a semiconductor substrate, or the like.

Figure 13B:
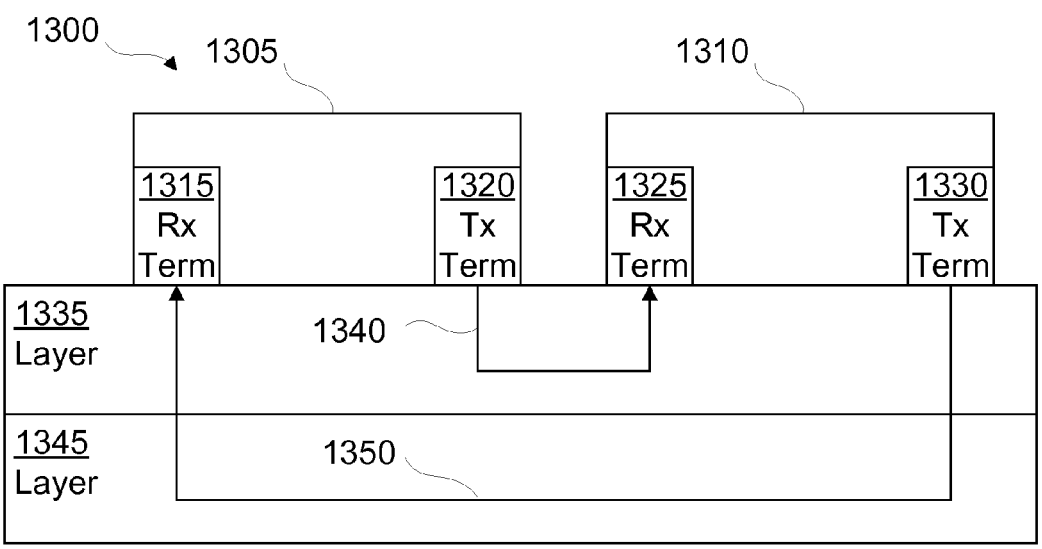
FIG. 13B illustrates an integrated circuit device, in accordance with an embodiment of the present invention.

FIG. 13B illustrates the integrated circuit device 1300, in accordance with an embodiment of the present invention. The integrated device 1300 illustrated in FIG. 13B is a side view of the integrated device 1300 illustrated in FIG. 13A. As illustrated in FIG. 13B, the integrated device further includes a layer 1345. The layer 1335 is disposed on the layer 1345, and each of the semiconductor die 1305 and 1310 is disposed on the layer 1335. The Tx data lines 1340 connected between the Tx terminals 1320 of the semiconductor die 1305 and the Rx terminals 1325 of the semiconductor die 1310 pass through the layer 1335. The Rx data lines 1350 connected between the Rx terminals 1315 of the semiconductor die 1305 and the Tx terminals 1330 of the semiconductor die 1310 pass through the layer 1345. In this way, cross-coupling is reduced between the Tx data lines 1340 and the Rx data lines 1350.

Figure 14A:
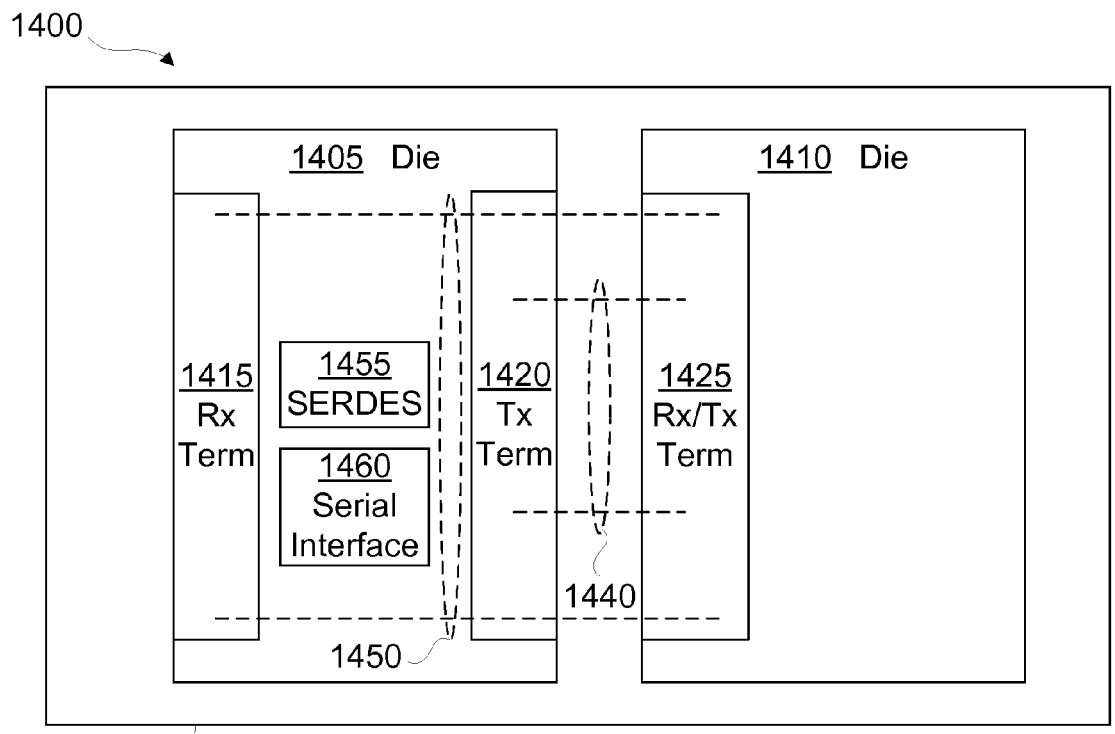
FIG. 14A illustrates an integrated circuit device, in accordance with an embodiment of the present invention.

FIG. 14A illustrates an integrated circuit device 1400, in accordance with an embodiment of the present invention. The integrated circuit device 1400 includes a semiconductor die 1405 and a semiconductor die 1410, each of which is disposed on a layer 1435. The semiconductor die 1405 includes Rx terminals 1415 and Tx terminals 1420. The semiconductor die 1410 includes Rx terminals 1425 and Tx terminals 1430. The Tx terminals 1420 of the semiconductor die 1405 are connected to the Rx terminals 1425 of the semiconductor die 1410 through Tx data lines 1440. The Rx terminals 1415 of the semiconductor die 1405 is connected to the Tx terminals 1430 of the semiconductor die 1410 through Rx data lines 1450. In some embodiments, the semiconductor die includes a SERDES 1455 centrally positioned on the semiconductor die 1405 and one or more serial interfaces 1460 connected to the SERDES 1435, the Rx terminals 1415, and the Tx terminals 1430. In the integrated circuit device 1400 illustrated in FIG. 14A, connections between the serial interfaces 1460 and the SERDES 1435, the Rx terminals 1415, and the Tx terminals 1430 are omitted to provide clarity for other features illustrated in FIG. 14A. In various embodiments, the layer 1435 may be a layer of a printed circuit board, a layer of a line card, a semiconductor substrate, a layer formed on a semiconductor substrate, or the like.

Figure 14B:
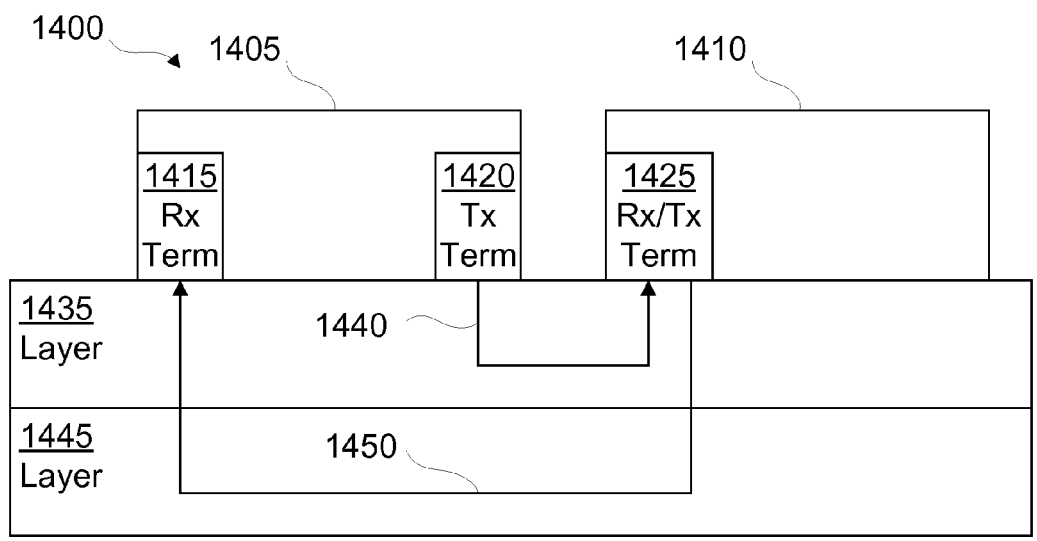
FIG. 14B illustrates an integrated circuit device, in accordance with an embodiment of the present invention.

FIG. 14B illustrates the integrated circuit device 1400, in accordance with an embodiment of the present invention. The integrated device 1400 illustrated in FIG. 14B is a side view of the integrated device 1400 illustrated in FIG. 14A. As illustrated in FIG. 14B, the integrated device further includes a layer 1445. The layer 1435 is disposed on the layer 1445, and each of the semiconductor die 1405 and 1410 is disposed on the layer 1435. The Tx data lines 1440 connected between the Tx terminals 1420 of the semiconductor die 1405 and the Rx terminals 1425 of the semiconductor die 1410 pass through the layer 1435. The Rx data lines 1450 connected between the Rx terminals 1415 of the semiconductor die 1405 and the Tx terminals 1430 of the semiconductor die 1410 pass through the layer 1445. In this way, cross-coupling is reduced between the Tx data lines 1440 and the Rx data lines 1450.

Figure 15A:
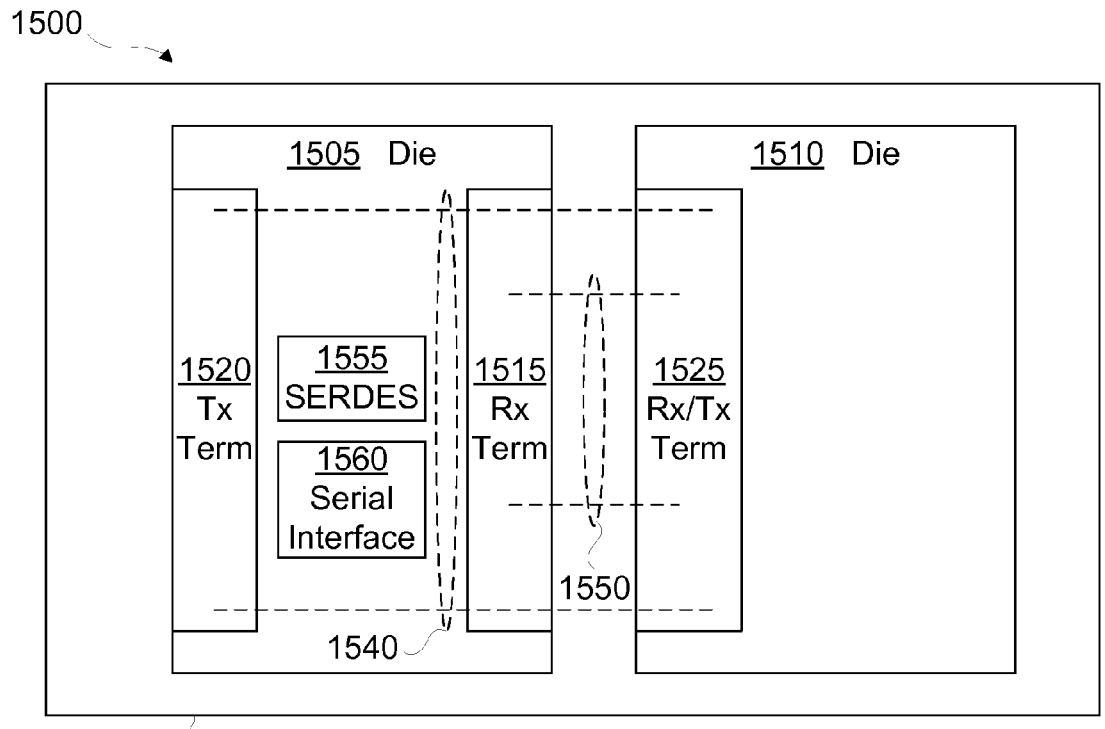
FIG. 15A illustrates an integrated circuit device, in accordance with an embodiment of the present invention.

FIG. 15A illustrates an integrated circuit device 1500, in accordance with an embodiment of the present invention. The integrated circuit device 1500 includes a semiconductor die 1505 and a semiconductor die 1510, each of which is disposed on a layer 1535. The semiconductor die 1505 includes Rx terminals 1515 and Tx terminals 1520. The semiconductor die 1510 includes Rx terminals 1525 and Tx terminals 1530. The Tx terminals 1520 of the semiconductor die 1505 are connected to the Rx terminals 1525 of the semiconductor die 1510 through Tx data lines 1540. The Rx terminals 1515 of the semiconductor die 1505 is connected to the Tx terminals 1530 of the semiconductor die 1510 through Rx data lines 1550. In some embodiments, the semiconductor die includes a SERDES 1555 centrally positioned on the semiconductor die 1505 and one or more serial interfaces 1560 connected to the SERDES 1535, the Rx terminals 1515, and the Tx terminals 1530. In the integrated circuit device 1500 illustrated in FIG. 15A, connections between the serial interfaces 1560 and the SERDES 1535, the Rx terminals 1515, and the Tx terminals 1530 are omitted to provide clarity for other features illustrated in FIG. 15A. In various embodiments, the layer 1535 may be a layer of a printed circuit board, a layer of a line card, a semiconductor substrate, a layer formed on a semiconductor substrate, or the like.

Figure 15B:
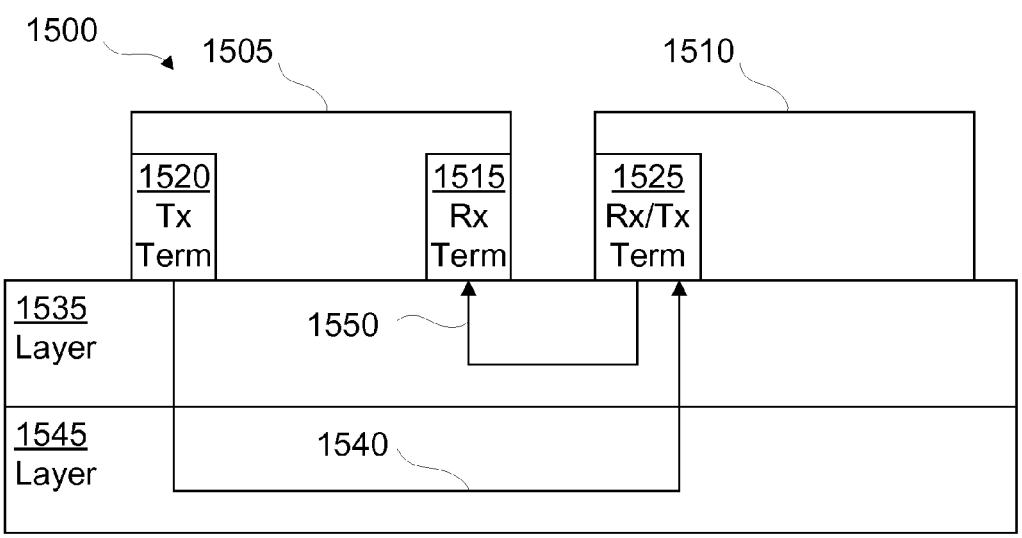
FIG. 15B illustrates an integrated circuit device, in accordance with an embodiment of the present invention.

FIG. 15B illustrates the integrated circuit device 1500, in accordance with an embodiment of the present invention. The integrated device 1500 illustrated in FIG. 15B is a side view of the integrated device 1500 illustrated in FIG. 15A. As illustrated in FIG. 15B, the integrated device further includes a layer 1545. The layer 1535 is disposed on the layer 1545, and each of the semiconductor die 1505 and 1510 is disposed on the layer 1535. The Tx data lines 1540 connected between the Tx terminals 1520 of the semiconductor die 1505 and the Rx terminals 1525 of the semiconductor die 1510 pass through the layer 1535. The Rx data lines 1550 connected between the Rx terminals 1515 of the semiconductor die 1505 and the Tx terminals 1530 of the semiconductor die 1510 pass through the layer 1545. In this way, cross-coupling is reduced between the Tx data lines 1540 and the Rx data lines 1550.

The present invention has been described by various examples above. However, the aforementioned examples are illustrative only and are not intended to limit the invention in any way. The skilled artisan would readily appreciate that the examples above are capable of various modifications. Thus, the invention is defined by the claims set forth below.

What is claimed is:

1. An integrated circuit device comprising:
   a first semiconductor die comprising;
      a central axis dividing the first semiconductor die into a first portion and a second portion;
      a first serial interface located approximately at the central axis, the serial interface comprising a first transmitter port and a first receiver port;
      a first plurality of Tx data lines connected to the first transmitter port and extending away from the central axis, at least one Tx data line of the first plurality of Tx lines located in both the first portion and the second portion of the first semiconductor die; and
      a first plurality of Rx data lines connected to the first receiver port and extending away from the central axis, at least one Rx data line of the first plurality of Rx lines located in both the first portion and the second portion of the first semiconductor die.

2. The integrated circuit device of claim 1, wherein the first semiconductor die further comprises:
   a SERDES located approximately at the central axis and coupled to both the plurality of receiver ports and the plurality of transmitter ports of the first serial interface.

3. The integrated circuit device of claim 2, wherein the SERDES comprises a width perpendicular to the central axis and defining an overlap region extending along the central axis, and wherein the at least one Tx data line is contained within the first portion and the overlap region, and wherein the at least one Rx data line is contained within the second portion and the overlap region.

4. The integrated circuit device of claim 2, wherein the Tx port of the first serial interface is separated from the Rx port of the first serial interface by the SERDES.

5. The integrated circuit device of claim 1, wherein the first plurality of Tx lines are separated from the first plurality of Rx lines to inhibit cross-coupling.

6. The integrated circuit device of claim 1 further comprising;
   a second serial interface located approximately at the central axis, the serial interface comprising a second transmitter port and a second receiver port;
   a second plurality of Tx data lines connected to the second transmitter port and extending away from the central axis, at least one Tx data line of the second plurality of Tx lines located in both the first portion and the second portion of the first semiconductor die; and
   a second plurality of Rx data lines connected to the second receiver port and extending away from the central axis, at least one Rx data line of the second plurality of Rx lines located in both the first portion and the second portion of the first semiconductor die.

7. The integrated circuit device of claim 6, wherein the first serial interface is separated from the second serial interface by the SERDES.

8. The integrated circuit device of claim 6, wherein the Tx port of the first serial interface is adjacent to the Rx port of the second serial interface.

9. The integrated circuit device of claim 6, wherein the Tx port of the first serial interface is adjacent to the Tx port of the second serial interface.

10. The integrated circuit device of claim 1, further comprising:
    a first layer, wherein the first semiconductor die is mounted to the first substrate and includes a first edge, a second edge, and a serial interface including a plurality of Tx ports and a plurality of RX ports;
    a second semiconductor die mounted to the first substrate and having a first edge, a second edge, and a serial interface including a plurality of Tx ports and a plurality of Rx ports; and
    a second layer mounted to the first substrate, wherein the first plurality of data lines pass through the first substrate, and wherein the second plurality of data lines pass through the second substrate.

11. An integrated circuit device comprising:
    a first semiconductor die comprising;
       a central axis dividing the first semiconductor die into a first portion and a second portion;
       a serial interface located approximately at the central axis, the serial interface comprising a first transmitter port and a first receiver port;
       a first plurality of Tx data lines connected to the first transmitter port and extending away from the central axis, at least one Tx data line of the first plurality of Tx lines located in both the first portion and the second portion of the first semiconductor die;
       a first plurality of Rx data lines connected to the first receiver port and extending away from the central axis, at least one Rx data line of the first plurality of Rx lines located in both the first portion and the second portion of the first semiconductor die; and
       a SERDES located approximately at the central axis and coupled to both the first receiver port and the first transmitter port of the first serial interface.

12. The integrated circuit device of claim 11, wherein the SERDES comprises a width perpendicular to the central axis and defining an overlap region extending along the central axis, and wherein the at least one Tx data line is contained within the first portion and the overlap region, and wherein the at least one Rx data line is contained within the second portion and the overlap region.

13. The integrated circuit device of claim 11, wherein the Tx port of the first serial interface is separated from the Rx port of the first serial interface by the SERDES.

14. The integrated circuit device of claim 11, wherein the first plurality of Tx lines are separated from the first plurality of Rx lines to inhibit cross-coupling.

15. The integrated circuit device of claim 11 further comprising;
- a second serial interface located approximately at the central axis, the serial interface comprising a second transmitter port and a second receiver port;
- a second plurality of Tx data lines connected to the second transmitter port and extending away from the central axis, at least one Tx data line of the second plurality of Tx lines located in both the first portion and the second portion of the first semiconductor die; and
- a second plurality of Rx data lines connected to the second receiver port and extending away from the central axis, at least one Rx data line of the second plurality of Rx lines located in both the first portion and the second portion of the first semiconductor die.

16. The integrated circuit device of claim 15, wherein the first serial interface is separated from the second serial interface by the SERDES.

17. The integrated circuit device of claim 15, wherein the Tx port of the first serial interface is adjacent to the Rx port of the second serial interface.

18. The integrated circuit device of claim 15, wherein the Tx port of the first serial interface is adjacent to the Tx port of the second serial interface.

19. The integrated circuit device of claim 11, further comprising:
- a first layer, wherein the first semiconductor die is mounted to the first substrate and includes a first edge, a second edge, and a serial interface including a plurality of Tx ports and a plurality of RX ports;
- a second semiconductor die mounted to the first substrate and having a first edge, a second edge, and a serial interface including a plurality of Tx ports and a plurality of Rx ports; and
- a second layer mounted to the first substrate, wherein the first plurality of data lines pass through the first substrate, and wherein the second plurality of data lines pass through the second substrate.

20. An integrated circuit device comprising:
a first semiconductor die comprises:
- a central axis dividing the first semiconductor die into a first portion and a second portion;
- a first serial interface located approximately at the central axis, the first serial interface comprising a first transmitter port and a first receiver port;
- a first plurality of Tx data lines connected to the first transmitter port and extending away from the central axis, at least one Tx data line of the first plurality of Tx lines located in both the first portion and the second portion of the first semiconductor die;
- a first plurality of Rx data lines connected to the first receiver port and extending away from the central axis, at least one Rx data line of the first plurality of Rx lines located in both the first portion and the second portion of the first semiconductor die; and
- a SERDES located approximately at the central axis and coupled to both the first receiver port and the first transmitter port of the serial interface, the SERDES comprising a width defining an overlap region extending away from the central axis, and wherein the at least one Tx data line is contained within the first portion and the overlap region, and wherein the at least one Rx data line is contained within the second portion and the overlap region.

21. The integrated circuit device of claim 20, wherein the Tx port of the first serial interface is separated from the Rx port of the first serial interface by the SERDES.

22. The integrated circuit device of claim 20, wherein the first plurality of Tx lines are separated from the first plurality of Rx lines to inhibit cross-coupling.

23. The integrated circuit device of claim 20 further comprising;
- a second serial interface located approximately at the central axis, the serial interface comprising a second transmitter port and a second receiver port;
- a second plurality of Tx data lines connected to the second transmitter port and extending away from the central axis, at least one Tx data line of the second plurality of Tx lines located in both the first portion and the second portion of the first semiconductor die; and
- a second plurality of Rx data lines connected to the second receiver port and extending away from the central axis, at least one Rx data line of the second plurality of Rx lines located in both the first portion and the second portion of the first semiconductor die.

24. The integrated circuit device of claim 23, wherein the first serial interface is separated from the second serial interface by the SERDES.

25. The integrated circuit device of claim 23, wherein the Tx port of the first serial interface is adjacent to the Rx port of the second serial interface.

26. The integrated circuit device of claim 23, wherein the Tx port of the first serial interface is adjacent to the Tx port of the second serial interface.

27. The integrated circuit device of claim 20, further comprising:
- a first layer, wherein the first semiconductor die is mounted to the first substrate and includes a first edge, a second edge, and a serial interface including a plurality of Tx ports and a plurality of RX ports;
- a second semiconductor die mounted to the first substrate and having a first edge, a second edge, and a serial interface including a plurality of Tx ports and a plurality of Rx ports; and
- a second layer mounted to the first substrate, wherein the first plurality of data lines pass through the first substrate, and wherein the second plurality of data lines pass through the second substrate.

* * * * *